United States Patent
Habuka et al.

(10) Patent No.: US 7,961,821 B2
(45) Date of Patent: *Jun. 14, 2011

(54) COMMUNICATION SEMICONDUCTOR INTEGRATED CIRCUIT, RADIO COMMUNICATION SYSTEM, AND ADJUSTMENT METHOD OF GAIN AND OFFSET

(75) Inventors: Toshihito Habuka, Tamamura (JP); Naoto Inokawa, Takasaki (JP); Kiyoharu Ozaki, Takasaki (JP); Tatsuji Matsuura, Suginami (JP); Koichi Yahagi, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 253 days.

This patent is subject to a terminal disclaimer.

(21) Appl. No.: 12/276,532

(22) Filed: Nov. 24, 2008

(65) Prior Publication Data

US 2009/0080577 A1 Mar. 26, 2009

Related U.S. Application Data

(63) Continuation of application No. 10/855,596, filed on May 28, 2004, now Pat. No. 7,471,748.

(30) Foreign Application Priority Data

Jun. 24, 2003 (JP) ................................. 2003-178984

(51) Int. Cl.
*H04L 27/08* (2006.01)

(52) U.S. Cl. ........................................................ 375/345
(58) Field of Classification Search .................. None
See application file for complete search history.

(56) References Cited

U.S. PATENT DOCUMENTS

| 6,321,073 | B1 | 11/2001 | Luz et al. |
|---|---|---|---|
| 6,442,380 | B1 | 8/2002 | Mohindra |
| 6,977,976 | B1 | 12/2005 | Birkett et al. |
| 7,171,185 | B2 | 1/2007 | Matsumoto et al. |
| 2003/0156668 | A1 | 8/2003 | Atkinson et al. |

FOREIGN PATENT DOCUMENTS

| JP | 2001 160835 | 6/2001 |
|---|---|---|
| JP | 2002 217762 | 8/2002 |

*Primary Examiner* — Khanh C Tran
(74) *Attorney, Agent, or Firm* — Mattingly & Malur, P.C.

(57) ABSTRACT

A D.C. offset canceling and gain adjusting techniques permitting completion of correction of D.C. offsets and gain adjustment of amplifiers for amplifying reception signals in a radio communication system are provided. A communication semiconductor integrated circuit has a plurality of low-pass filters and variable gain amplifiers which are alternately connected in multiple stages, and high gain amplifier circuits for amplifying reception signals to a predetermined amplitude level. Offset cancellation values are generated by detecting D.C. offsets of amplifiers for amplifying reception signals according to a set gain, and stored into a memory, and read out of the memory to cancel the D.C. offsets of the amplifiers when starting reception and altering the gain. Gain setting in a high gain amplifying section is accomplished using rough and precise settings.

5 Claims, 13 Drawing Sheets

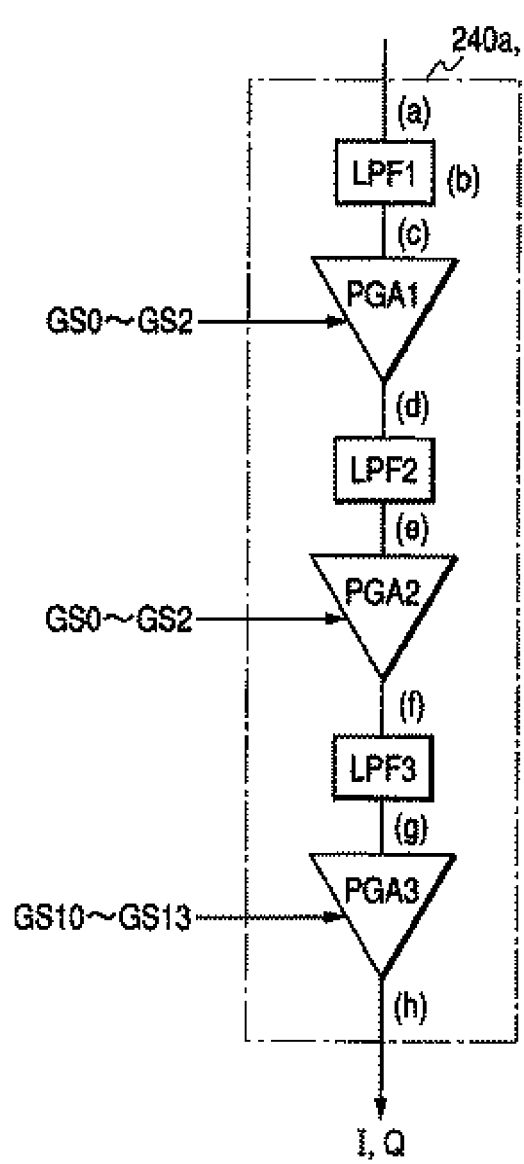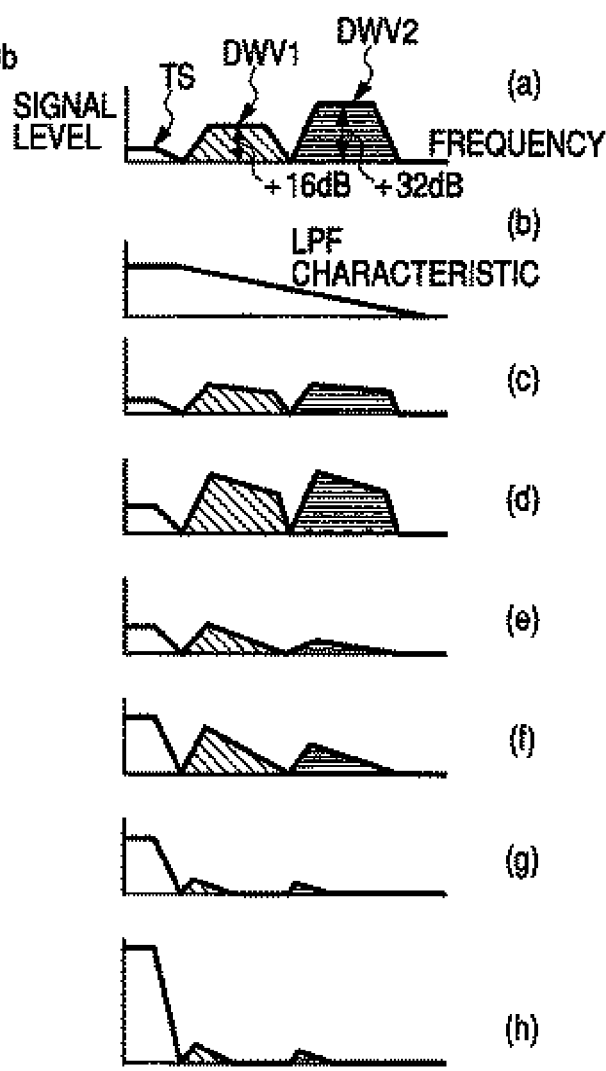

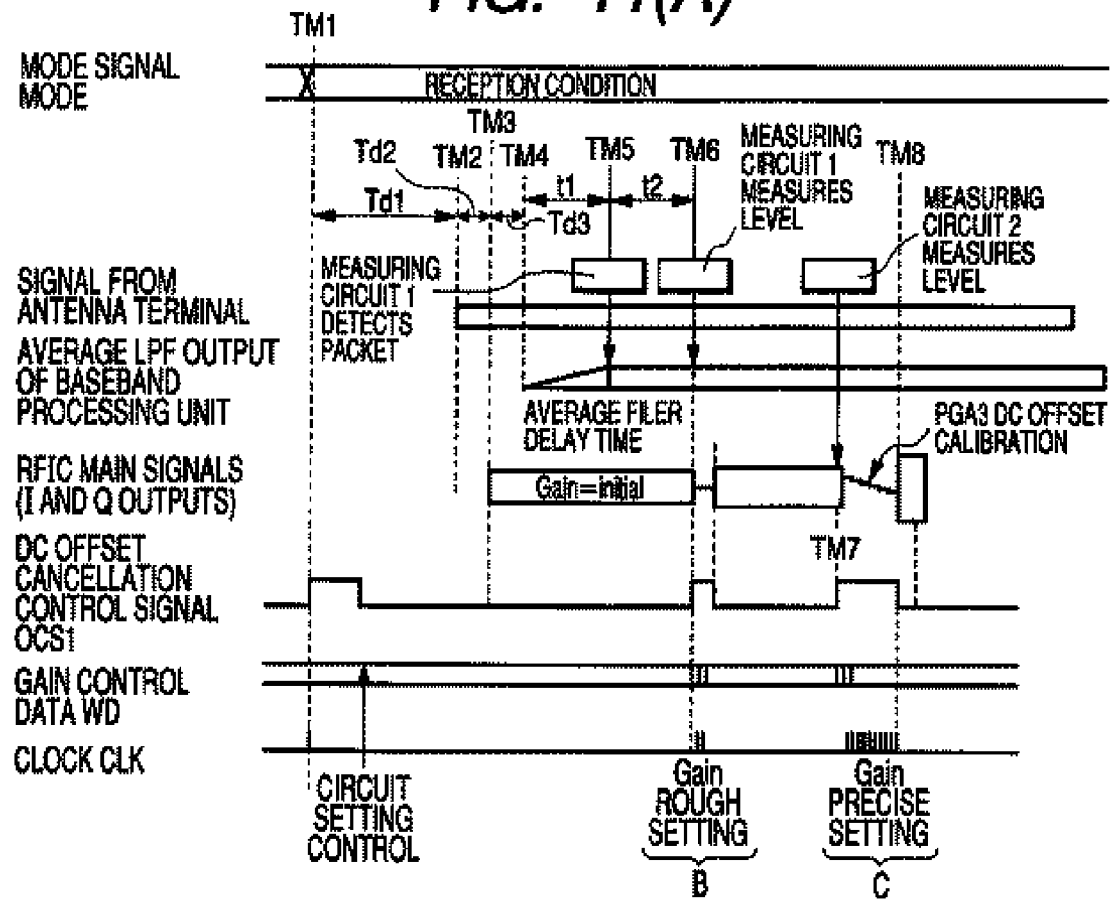
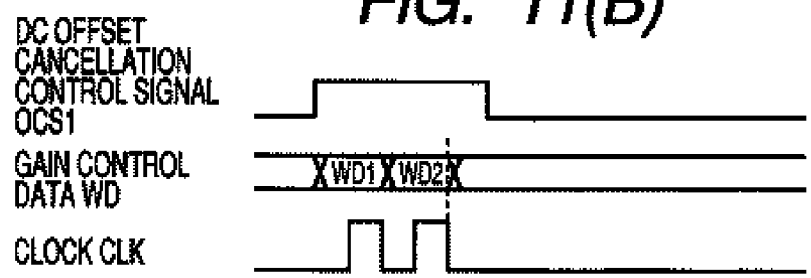
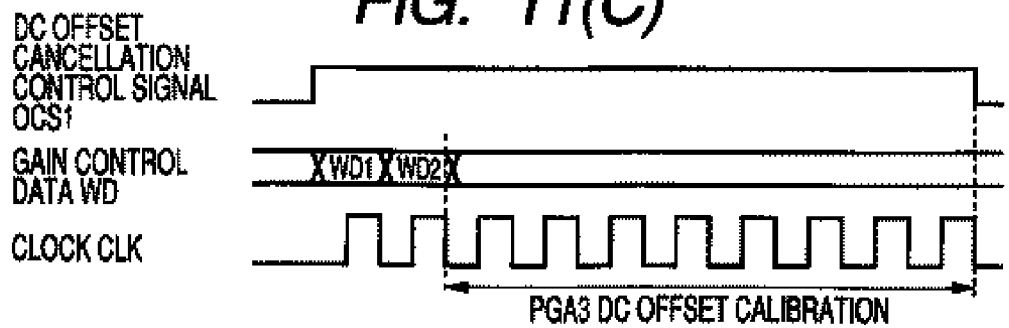

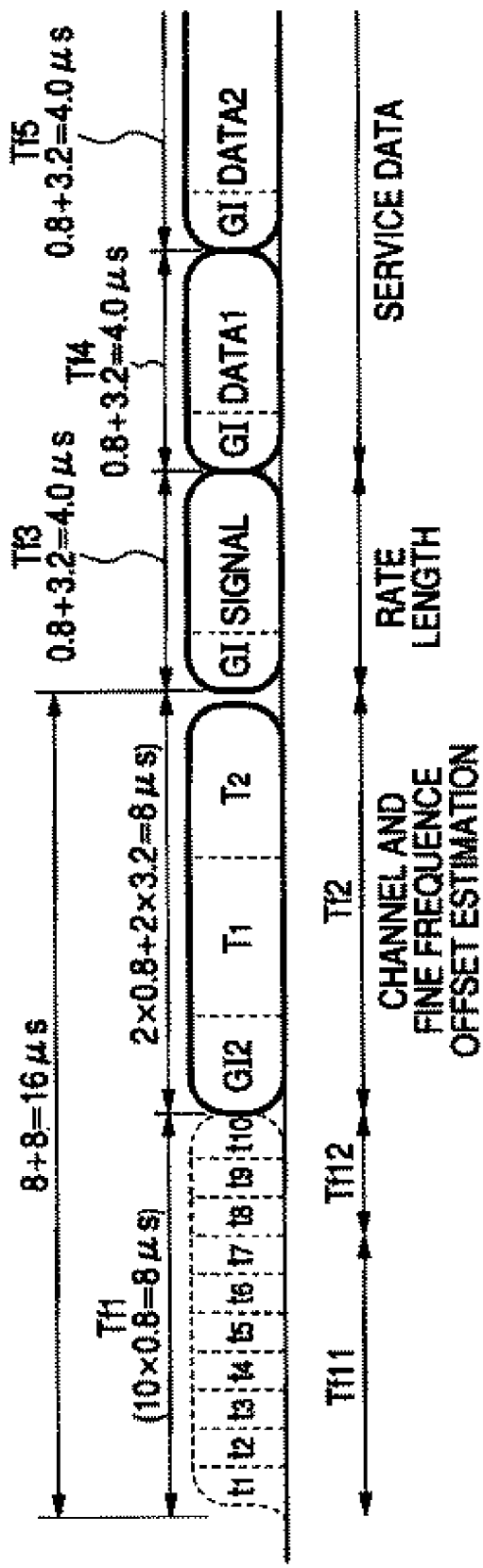

FIG. 14

| | GS2 | GS1 | GS0 | PGA1 GAIN (dB) | PGA2 GAIN (dB) | PGA1+PGA2 (dB) | REMARKS |
|---|---|---|---|---|---|---|---|
| a | 1 | 1 | 1 | +18 | +18 | +36 | |
| b | 1 | 1 | 0 | +18 | +12 | +30 | PRIORITY GIVEN TO SECURING NF |
| c | 1 | 0 | 1 | +12 | +18 | +30 | PRIORITY GIVEN TO INTERFERENCE SUPPRESSION |
| d | 1 | 0 | 0 | +12 | +12 | +24 | |
| e | 0 | 1 | 1 | +12 | +6 | +18 | |
| f | 0 | 1 | 0 | +6 | +6 | +12 | |
| g | 0 | 0 | 1 | +6 | 0 | +6 | |
| h | 0 | 0 | 0 | 0 | 0 | 0 | |

FIG. 15

| GS13 | GS12 | GS11 | GS10 | GAIN (dB) |
|---|---|---|---|---|
| 1 | 1 | 1 | 1 | +18 |
| 1 | 1 | 1 | 0 | +16 |
| 1 | 1 | 0 | 1 | +14 |
| 1 | 1 | 0 | 0 | +12 |
| 1 | 0 | 1 | 1 | +10 |
| 1 | 0 | 1 | 0 | +8 |
| 1 | 0 | 0 | 1 | +6 |
| 1 | 0 | 0 | 0 | +4 |
| 0 | 1 | 1 | 1 | +2 |
| 0 | 1 | 1 | 0 | 0 |
| 0 | 1 | 0 | 1 | −2 |
| 0 | 1 | 0 | 0 | −4 |
| 0 | 0 | 1 | 1 | −6 |
| 0 | 0 | 1 | 0 | −6 |
| 0 | 0 | 0 | 1 | −6 |
| 0 | 0 | 0 | 0 | −6 |

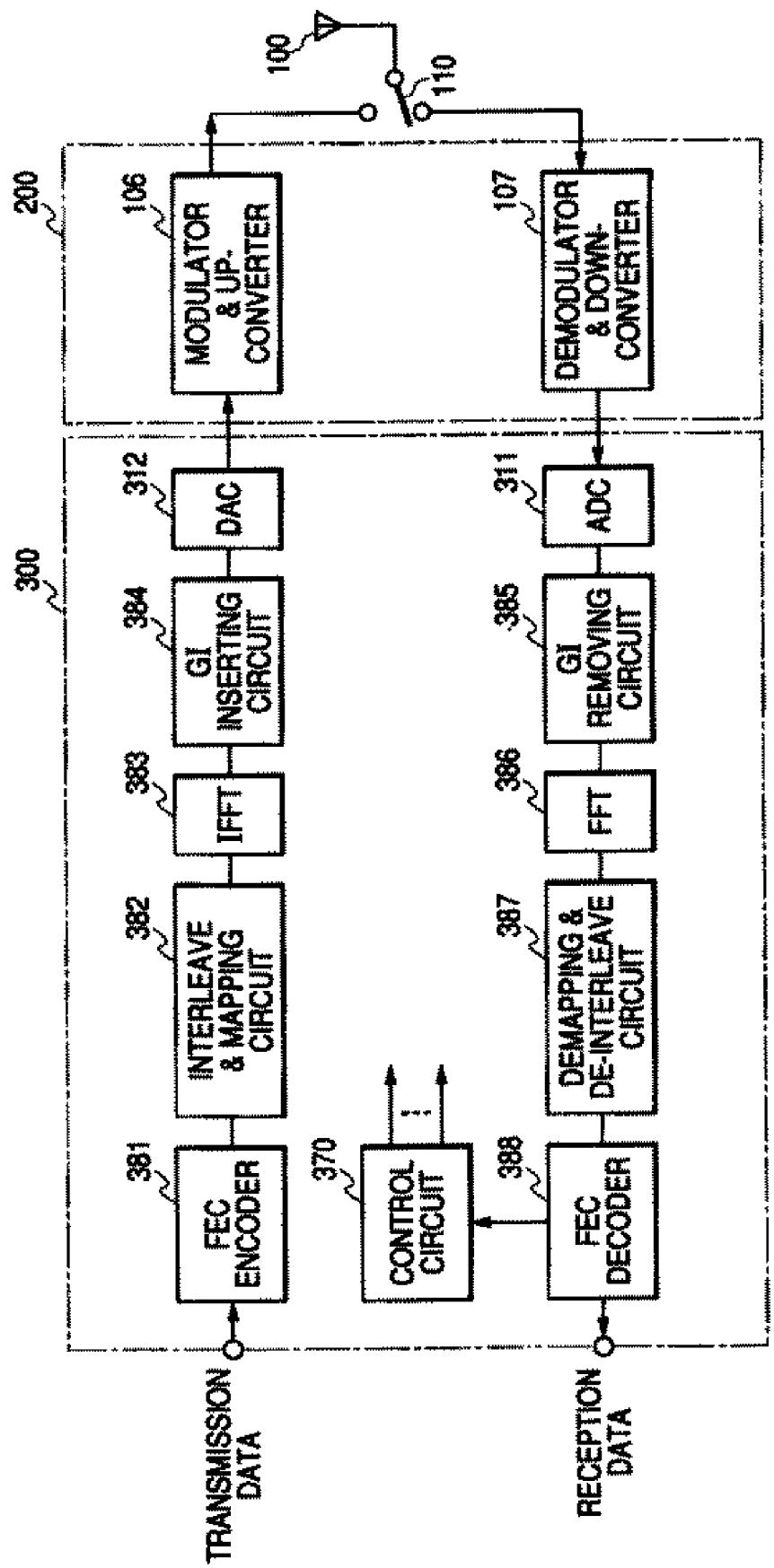

COMMUNICATION SEMICONDUCTOR INTEGRATED CIRCUIT, RADIO COMMUNICATION SYSTEM, AND ADJUSTMENT METHOD OF GAIN AND OFFSET

CROSS-REFERENCE TO RELATED APPLICATION

The present application is a continuation of application Ser. No. 10/855,596, filed May 28, 2004 now U.S. Pat. No. 7,471,748; which claims priority from Japanese patent application No. JP 2003-178984 filed on Jun. 24, 2003, the content of which is hereby incorporated by reference into this application.

BACKGROUND OF THE INVENTION

The present invention relates to a technique that can be effectively applied to the correction of D.C. offsets and the adjustment of gains in a variable gain amplifier circuit provided in the reception circuitry of a radio communication system and to a high gain amplifier circuit which successively amplifies reception signals with a plurality of amplifier circuits in multiple stage connection, for instance a technique that can be effectively utilized in a wireless local area network (LAN) system and high frequency semiconductor integrated circuits (ICs) and baseband large scale integrated circuits (LSIs) used therein.

A wireless LAN system or a cellular phone is usually provided with a high gain amplifier circuit which comprises a plurality of low-pass filters and variable gain amplifiers alternately connected in a multiple stage configuration and amplifies I signals and Q signals to respectively predetermined amplitude levels while eliminating unnecessary waves in order to amplify down-converted and demodulated reception signals (I signals which are components in phase with a fundamental wave and Q signals which are components orthogonal thereto) to predetermined levels and delivering them to a baseband circuit.

In a reception circuit wherein mixers for down-converting and demodulating reception signals, a high gain amplifier circuit at a stage subsequent thereto and variable gain amplifiers of the individual stages constituting the high gain amplifier circuit are D.C. coupled to each other, any D.C. offset occurring in the output of a mixer would be amplified by the variable gain amplifiers constituting the high gain amplifier circuit, and at the same time any D.C. offset in a variable gain amplifier at a prior stage would be significantly amplified by another variable gain amplifier at a subsequent stage, resulting in variations in the D.C. voltages of the outputs of the amplifiers.

Known formulas proposed for correcting D.C. offsets in variable gain amplifiers constituting a high gain amplifier circuit for amplifying reception signals in a radio communication system include, for instance, one by which output signals are subjected to A/D conversion by an A/D converter in a state in which the differential input terminals of variable gain amplifiers are short-circuited to each other, a value to make those outputs "0" is generated and subjected to D/A conversion by a D/A converter, and the converted value is added to input signals to the variable gain amplifiers (see Patent Reference 1), and another by which D.C. offsets are detected from carrier leaks arising from re-modulation of demodulated I and Q signals (see Patent Reference 2).

Patent Reference 1

Japanese Unexamined Patent Publication No. 2002-217762

Patent Reference 2

Japanese Unexamined Patent Publication No. 2001-160835

SUMMARY OF THE INVENTION

For a wireless LAN system conforming to the IEEE802.11a Protocol, it is prescribed that packet detection, gain control, frequency tuning-in in a PLL circuit and D.C. offset adjustment of amplifiers should be performed during the eight microsecond period (short symbol period) at the beginning of a transmitted/received packet. As the D.C. offset cancellation formula according to the invention described in Patent Reference 1 narrows down the range of offset cancellation values by consecutive comparing actions by an A/D converter, this takes a relatively long time. For this reason it has been revealed that, though this formula is applicable to a radio communication system, such as a cellular phone, in which there is little hurry at the time of reception start, its application is difficult to a wireless LAN system in which little time is allowed for D.C. offset cancellation.

On the other hand, as the formula described in Patent Reference 2 by which D.C. offsets are detected from carrier leaks, a modulator for re-modulating I and Q signals demodulated from reception signals and a carrier leak detecting circuit are additionally required, the circuit dimensions will increase and, moreover, errors may occur in the modulator and the carrier leak detecting circuit.

An object of the present invention is to provide a D.C. offset cancellation technique suitable for use in a radio communication system in which the correction of D.C. offsets in amplifiers for amplifying reception signals has to be completed in a relatively short period of time.

Another object of the invention is to provide a gain adjustment technique suitable for use in a radio communication system, such as a wireless LAN system, in which gains are frequently altered in the amplifier unit for reception signals.

Still another object of the invention is to provide a reception signal detecting technique capable of accurately detecting reception signals and the level of the reception signals in short period of time.

The above-stated and other objects and novel features of the invention will become more apparent from the following description in the specification when taken in conjunction with the accompanying drawings.

Typical aspects of the invention disclosed in the present application will be briefly described below.

Thus according to the invention, the D.C. offsets of amplifiers to amplify reception signals are detected in advance according to the set gain, offset cancellation values are generated and stored into a memory, read out of the memory at the time of starting reception and altering the gain, and the D.C. offsets of the amplifiers are caused to be cancelled. Also, the amplifiers to amplify the gains of the reception signals are set at two stages, rough and precise.

The means described above, since it need not detect the D.C. offsets of the amplifiers at the time of starting reception and can cancel the D.C. offsets of the amplifiers with offset cancellation values, offset cancellation is completed in a short period of time. Further in the plurality of variable gain amplifiers, though the D.C. offset differs with the set gain, i.e. with the amplifier used, by storing the D.C. offset cancellation values of the amplifiers in the memory according to set gains, it is enabled to immediately cancel, when the gain is altered, the D.C. offset of the amplifier according to the pertinent offset cancellation value stored in the memory.

Further, where the high gain amplifier circuit for amplifying reception signals to a predetermined amplitude level consist of a plurality of variable gain amplifiers connected in multiple stages, a variable gain amplifier at a prior stage cancels a D.C. offset according to an offset cancellation value read out of a memory, and D.C. offset cancellation by the variable gain amplifier at the final stage is accomplished on a real time basis after the completion of offset cancellation by the prior variable gain amplifier. This makes possible prompt and highly precise D.C. offset correction because rough D.C. offset cancellation is executed in the very short period of time allowed at the start of reception and D.C. offset cancellation of the whole reception circuit, covering the residual offset of the prior variable gain amplifier as well, is subsequently carried out.

Preferably, as the offset canceling circuit here, a circuit comprising an A/D converter for A/D conversion of the outputs of amplifiers and a D/A converter for D/A conversion of values canceling the detected offsets and so configured as to determine offset cancellation values by consecutive comparing actions by the A/D converter should be used. Such a circuit, as the A/D converter therein can be configured of a comparator and a simple circuit, such as a resistor voltage divider circuit to give voltages to be compared to the comparator, can be reduced in circuit dimensions.

According to a second aspect of the invention under the present application, the gain of a high gain amplifier circuit for amplifying reception signals into signals of a predetermined amplitude level is set in two steps of rough setting and precise setting on the basis of the detection of the level of the reception signals by a measuring circuit. The output of the level measuring circuit is made to pass an averaging filter of which the length of time taken by a signal at the input end to appear at the output end is set equal to the period of the reception signals to be measured and, after detecting that the signal having passed the averaging filter has reached or surpassed a predetermined level, the output level of the averaging filter after the lapse of the same length of time as the period of the reception signals is treated as the measured level. This makes it possible to detect the entrance of the reception signals in a short period of time after the start of reception, and to obtain the result of accurate level measurement of those reception signals without delay.

BRIEF DESCRIPTION OF THE DRAWINGS

FIG. 6(A) is a block configurational diagram of the high gain amplifying section built into a high frequency IC and FIG. 6(B) is an explanatory diagram showing the level distribution of frequency components of different parts in the high gain amplifying section.

FIG. 11(A) is a timing chart of various signals in a radio communication system to which the high frequency IC and the baseband LSI in the embodiment of the invention are applied, and FIG. 11(B) and FIG. 11(C) are timing charts showing on an enlarged scale a rough setting period B and a precise setting period C in FIG. 11 (A).

FIG. 12 illustrates an example of configuration of a wireless LAN packet conforming to the IEEE802.11a Protocol.

FIG. 13 illustrates an example of configuration of control data supplied from the baseband LSI to the high frequency IC in the radio communication system to which the high frequency IC and the baseband LSI in the embodiment of the invention are applied.

FIG. 14 is a code chart showing the relationship between the gain setting codes of control data supplied from the baseband LSI to the high frequency IC on the one hand and the gains of PGA1 and PGA2 and the total gains on the other.

FIG. 15 is a code chart showing the relationship between the gain setting codes of control data supplied from the baseband LSI to the high frequency IC and the gains of PGA3.

FIG. 18 is a block diagram showing an example of wireless LAN system conforming to the IEEE802.11a Protocol to which the invention can be suitably applied.

DETAILED DESCRIPTION OF THE PREFERRED EMBODIMENT

Next will be described a preferred embodiment of the present invention with reference to the accompanying drawings.

Figure 1:
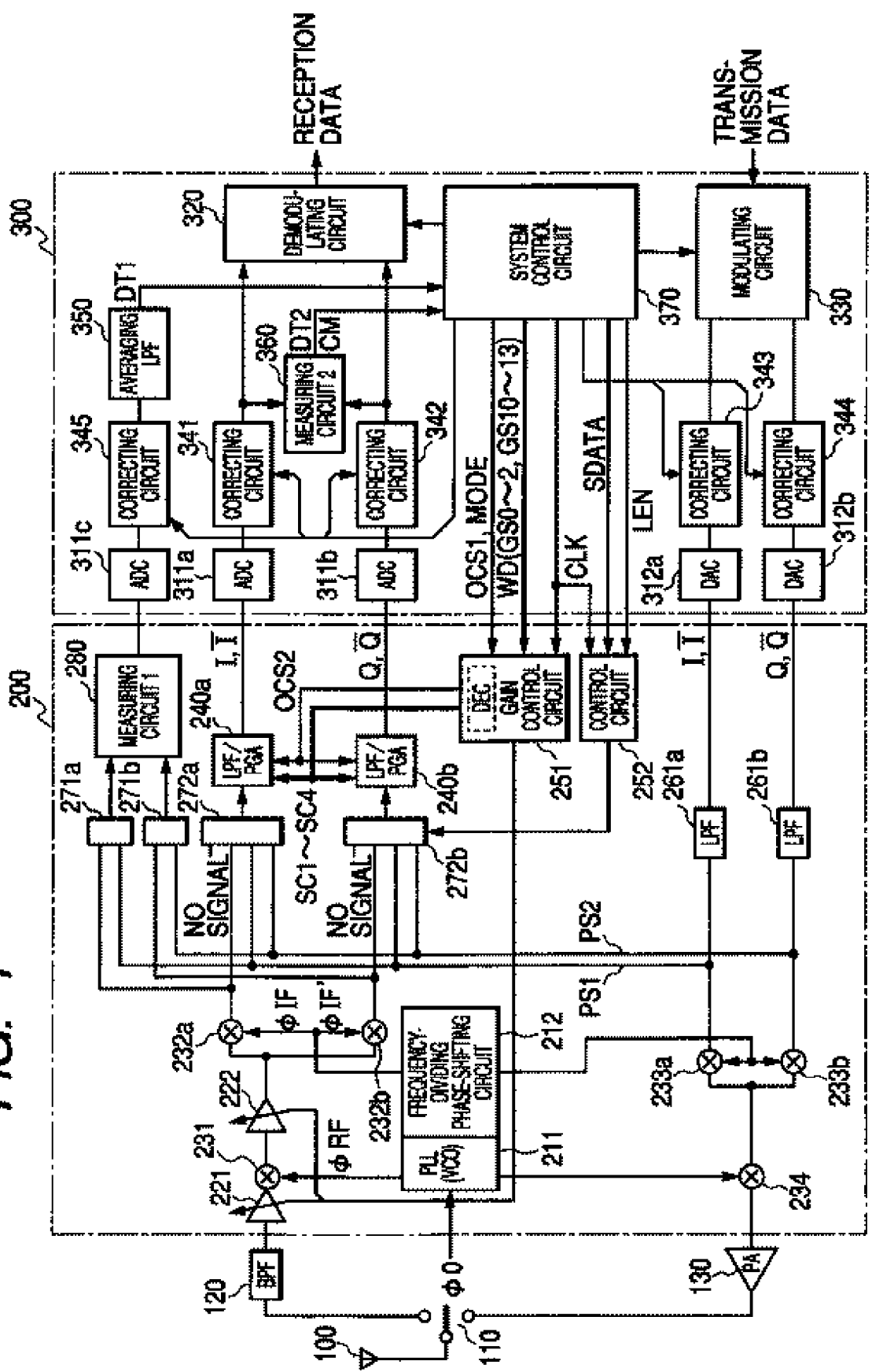
FIG. 1 is a block diagram showing an example of configuration of a high frequency IC and a baseband LSI constituting a radio communication system to which the present invention can be suitably applied.

FIG. 1 is a block diagram showing a radio communication system to which the present invention can be suitably applied and an example of configuration of a high frequency IC and a baseband LSI constituting the system.

The radio communication system, which embodies the invention in this manner, comprises an antenna 100 for transmitting and receiving signal waves, a switch 110 for changing over between transmission and reception, a band-pass filter 120 for removing unnecessary waves from reception signals, a power amplifier 130 for amplifying the power of transmission signals and transmitting them from the antenna 100, a high frequency IC 200 for down-converting reception signals and up-converting transmission signals, and a baseband LSI 300 performing modulation/demodulation and baseband processing.

FIG. 1 illustrates the system in a simplified way except the high frequency IC 200 and the baseband LSI 300. In an actual system, the power amplifier 130 is configured as a module (power module) together with an impedance matching circuit, a filter for removing harmonics and other elements over an insulating substrate, such as a ceramic substrate. The transmission/reception change-over switch 110 and the band-pass filter 120 are configured as another module (front end module) over another insulating substrate. These modules, together with the high frequency IC 200 and the baseband LSI 300, are mounted over a single printed circuit board to constitute a radio communication system.

The high frequency IC 200 is provided with a PLL circuit 211 containing a voltage control oscillator (VCO) for generating, on the basis of a reference signal φ0 from outside the chip, a high frequency signal φRF having a higher frequency than the reference signal; a frequency-dividing phase-shifting circuit 212 for dividing the frequency of the high frequency signal φRF and generating signals φIF and φIF' differing in phase from each other by 90 degrees; a low noise amplifier 221 for amplifying the reception signals having passed the band-pass filter 120; a mixer 231 for mixing the reception signals amplified by the low noise amplifier 221 and the high frequency signal φRF generated by the PLL circuit 210 to down-convert them into signals of an intermediate frequency (IF); an IF amplifier 222 for further amplifying the down-converted reception signals; mixers 232a and 232b for mixing the amplified reception signals and the signals φIF and φIF' from the frequency-dividing phase-shifting circuit 212 differing in phase from each other by 90 degrees to down-convert them into signals of a still lower frequency and separating them into I and Q signals; high gain amplifying sections 240a and 240b, each having a low-pass filter (LPF), a variable gain amplifier (PGA) and an offset canceling circuit, for amplifying the I signals and the Q signals to respectively predetermined amplitude levels while removing unnecessary waves; a gain control circuit 251 for controlling the gains of the high gain amplifying sections 240a and 240b and of the amplifiers 221 and 222; and a signal level measuring circuit 280, to which the outputs of the mixers 232a and 232b are entered, for roughly detecting the amplitude level of the reception signals.

On the basis of control data WD including an offset cancellation control signal OCS1, a mode signal MODE and gain setting codes GS0 through GS2 and GS10 through GS13 supplied from the system control circuit 370 of the baseband LSI 300, the gain control circuit 251 generates and supplies an offset cancellation start instruction signal OCS2 and gain switching control signals SC1 through SC4 to the high gain amplifying sections 240a and 240b and the amplifiers 221 and 222. The gain control circuit 251 may be, though not limited to, provided with a decoder DEC for decoding the gain setting codes GS0 through GS2 and GS10 through GS13.

The high frequency IC 200 is provided with low-pass filters 261a and 261b for removing harmonics contained in the I signals and the Q signals on the transmitting side; mixers 233a and 233b for mixing the I signals and the Q signals having passed the low-pass filters 261a and 261b and the signals φIF and φIF' from the frequency-dividing phase-shifting circuit 212 differing in phase from each other by 90 degrees to achieve orthogonal modulation and up-convert them into signals of a higher frequency; and a mixer 234 for further up-converting the transmission signals having undergone modulation and frequency conversion by the mixers 233a and 233b, and supplying them to the power amplifier 130.

In the high frequency IC 200 of this embodiment of the invention, there are further provided signal paths PS1 and PS2 for conveying to the receiving side the I signals and the Q signals on the transmitting side having passed the low-pass filters 261a and 261b; selectors 271a and 271b for selecting and supplying to the signal level measuring circuit 280 either the I and Q signals from the signal paths PS1 and PS2 or the I and Q signals from the mixers 232a and 232b; selectors 272a and 272b for selecting and supplying to the high gain amplifying sections 240a and 240b either the I and Q signals from the signal paths PS1 and PS2 or the I and Q signals from the mixers 232a and 232b; and a control circuit 252 for generating control signals for use within the chip including switching control signals for these selectors.

Each of the selectors 272a and 272b is enabled to select and supply to the high gain amplifying sections 240a and 240b either of the I signals and the Q signals on the transmitting side as well as to select and supply to the high gain amplifying sections 240a and 240b "no signal". The "no signal" here means that the input is fixed to the bias point, i.e. the central potential of A.C. signals. The selector here means a circuit, such as a change-over circuit, consisting of a switching element which either transmits as they are or intercepts analog signals.

To add, although each of the selectors 272a and 272b in this embodiment is shown to be composed of a single circuit, it is also possible for each of them to be configured as a two stage or three stage selector or as a circuit known as a multiplexer which enables a plurality of devices (mixers and low-pass filters in this embodiment) to use one channel (a signal line in this embodiment) in a multiplex way.

The selectors 271a and 271b are so controlled in the normal state of reception as to supply the outputs of the mixers 232a and 232b to the measuring circuit 280, and the selectors 272a and 272b, to supply the outputs of the mixers 232a and 232b to the high gain amplifying sections 240a and 240b.

To the control circuit 252 are supplied clock signals CLK for synchronization, data signals SDATA and a load enable signal LEN as the control signal from the system control circuit 370 of the baseband LSI 300. When the load enable signal LEN is asserted to a valid level, the control circuit 252, in synchronism with the clock signals CLK, successively takes in data signals SDATA transmitted from the baseband circuit 300, and generates, on the basis of received control commands and control data, control signals for use within the high frequency IC 200 including switching control signals for the selectors 271a, 271b, 272a and 272b. The data signals SDATA may be, though are not necessarily, serially transmitted.

Separately from the control circuit 252, there is provided the gain control circuit 251 for performing parallel data transmission. This is because, as well be described afterwards, gain setting should be accomplished within an extremely short period of time at the time of starting reception, and the serial transmission of the gain control data WD by the control circuit 252 might be too slow to meet this time constraint. On the other hand, since there is sufficient time allowed for other actions than gain setting, for instance changing over or setting the internal state of the high frequency IC 200, command supply from the baseband LSI 300 to the control circuit 252 can be serially accomplished as in this embodiment. Although the control circuits 251 and 252 can as well be integrally configured, their separate arrangement facilitates circuit designing.

The baseband LSI 300 comprises A/D converter circuits 311a and 311b for converting the I signals and the Q signals on the receiving side supplied from the high frequency IC 200 into digital signals; a demodulating circuit 320 for restoring the reception data by demodulating the digital I and Q signals; a modulating circuit 330 for modulating transmission data to generate the digital I and Q signals; and D/A converter circuits 312a and 312b for converting the digital I and Q signals into analog I and Q signals.

The baseband LSI 300 comprises correcting circuits 341 and 342 for correcting the characteristics (gains and offsets) of the reception circuitry; correcting circuits 343 and 344 for correcting the characteristics of the transmission circuitry; an A/D converter circuit 311c for converting detection signals supplied from the signal level measuring circuit 280 of the high frequency IC 200 into digital signals; a correcting circuit 345 for correcting the characteristics of the measuring circuitry (the signal level measuring circuit 280 and the A/D converter circuit 311c); an averaging filter 350 for taking the time average of the output of the A/D converter circuit 311c; a second signal level measuring circuit 360 for measuring the exact amplitude level of the reception signals from the outputs of the A/D converter circuits 311a and 311b; and the system control circuit 370 for generating control signals for circuits within the chip, generating, on the basis of the outputs of the averaging filter 350 and the second signal level measuring circuit 360, gain control data for controlling the gains of the reception circuitry in the high frequency IC 200 and supplying them to the high frequency IC 200, detecting any errors in the reception circuitry, the transmission circuitry and the measuring circuitry and causing the correcting circuit 341 through 345 to generate correction control signals for correcting the errors.

Figure 9:
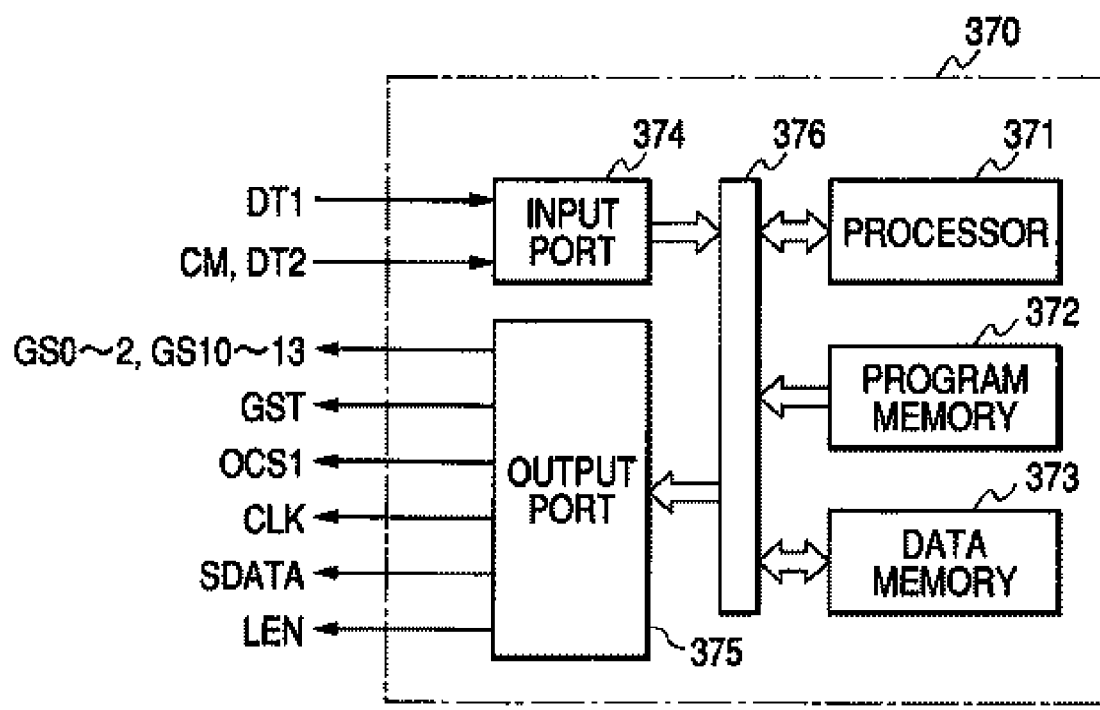
FIG. 9 is a block diagram showing an example of configuration of a control circuit built into the baseband LSI.

The system control circuit 370 can be configured of a circuit which, as shown in FIG. 9, has a configuration similar to that of a general purpose microcomputer or microprocessor (hereinafter generically referred to as a microcomputer) operating under a program. A wireless LAN system conforming to the IEEE802.11a Protocol uses for modulation the orthogonal frequency division multiplex (OFDM) formula. The baseband LSI 300 is so confirmed that the modulating circuit 330 and the demodulating circuit 320 perform modulation and demodulation, respectively, in accordance with the OFDM formula when this embodiment of the invention is applied to the wireless LAN system.

Hereupon, it may be pertinent to explain how errors are corrected in the reception circuitry, the transmission circuitry and the measuring circuitry in the system of this embodiment of the invention. Correction is performed by the execution of a correction program by the system control circuit 370 in the baseband LSI 300 at the time of turning on power supply or during an otherwise idle period when neither transmission nor reception is processed. The outlined contents and sequence of this correction are as follows: (1) correction of D.C. offsets in the reception circuitry; (2) correction of D.C. offsets in the transmission circuitry; (3) gain balance correction between the I side and the Q side of the transmission circuitry; (4) gain balance correction between the I side and the Q side of the reception circuitry; (5) D.C. offset correction and gain correction in the measuring circuitry. The gain balance correction between the I side and the Q side of the transmission circuitry of (3) and the gain balance correction between the I side and the Q side of the reception circuitry of (4) can be reversed in sequence.

In the D.C. offsets correction in the reception circuitry of (1), first the selectors 272a and 272b at the prior stage of the high gain amplifying sections 240a and 240b are controlled by sending control commands from the system control circuit 370 in the baseband LSI 300 to the control circuit 252 in the high frequency IC 200 to set in the "no signal" state, i.e. a state in which the potential at the bias point is supplied to the high gain amplifying sections 240a and 240b. Also, the gains of the high gain amplifying sections 240a and 240b are set to 0 dB by sending control data WD including a control signal OSC1 and gain setting codes GS0 through GS2 and GS10 through GS13 from the system control circuit 370 to the gain control circuit 251 in the high frequency IC 200.

Next, the detection of D.C. offsets in the variable gain amplifiers and the generation of correction data to correct those offsets are executed by having the gain control circuit 251 actuate the offset canceling circuits of the high gain amplifying sections 240a and 240b. After that, the offset-corrected outputs of the high gain amplifying sections 240a and 240b are entered into the baseband LSI 300. The entered outputs are converted by the A/D converter circuits 311a and 311b in the baseband LSI 300 into digital signals, whose amplitude levels are measured by the signal level measuring circuit 360 to detect residual offsets, and such correction data as will clear the system control circuit 370 of those residual offsets are supplied to the correcting circuits 341 and 342 by entering the resultant detection values into the system control circuit 370. D.C. offsets in the reception circuitry (the high gain amplifying section 240a, A/D converter circuit 311a, high gain amplifying section 240b and A/D converter circuit 311b) are reduced to "0".

In the correction of D.C. offsets in the transmission circuitry of (2), by sending control commands from the system control circuit 370 in the baseband LSI 300 to the control circuit 252 in the high frequency IC 200, the selectors 272a and 272b of the prior stage to the high gain amplifying section 240a are controlled to set a state in which the I signals on the transmitting side having passed the low-pass filters 261a and 261b are supplied to the high gain amplifying section 240a and the Q signals on the transmitting side having passed the low-pass filter 261b are supplied to the high gain amplifying section 240b. Further, the correcting circuits 343 and 344 are controlled by the system control circuit 370 to intercept signals from the modulating circuit 330 and thereby to set inputs to the D/A converter circuits 312a and 312b in a "no signal" state.

In this state, the outputs of the high gain amplifying sections 240a and 240b are entered into the baseband LSI 300 in which the A/D converter circuits 311a and 311b convert them into digital signals, and their amplitude levels are measured by the signal level measuring circuit 360 to detect D.C. offsets. As the D.C. offsets of the reception circuitry have already been corrected by the correction processing of (1) by that time, the detected D.C. offsets are those in the transmission circuitry. Accordingly, the resultant detection values are entered into the system control circuit 370, and such correction data as clear the system control circuit 370 of those D.C. offsets are provided to the correcting circuits 343 and 344. The D.C. offsets in the transmission circuitry (the D/A converter circuit 312a, low-pass filter 261a, D/A converter circuit 312 band low-pass filters 261b) are thereby reduced to "0".

In the gain balance correction between the I and Q sides of the transmission circuitry of (3), by sending control signals from the system control circuit 370 in the baseband LSI 300 to the modulating circuit 330, the input codes of the D/A converter circuits 312a and 312b are set to fixed values to set a state in which D.C. signals of predetermined levels are supplied from the D/A converter circuits 312a and 312b. Also, by sending control signals from the system control circuit 370 in the baseband LSI 300 to the control circuit 252 in the high frequency IC 200, the selectors 272a and 272b at the prior stage to the high gain amplifying sections 240a and 240b are controlled to cause the I signals and the Q signals on the transmitting side having passed the low-pass filters 261a and 261b to be alternately supplied to either one of the high gain amplifying sections 240a and 240b. Then, the signal level measuring circuit 360 measures the level difference between signals on the I side and signals on the Q side, and such correction measures as will reduce the level difference to "0" are provided to the correcting circuits 343 and 344 to eliminate gain inconsistency between the I signal side and the Q signal side in the transmission circuitry.

In the gain balance correction between the I and Q sides of the reception circuitry of (4), by sending control signals from the system control circuit 370 in the baseband LSI 300 to the modulating circuit 330, the input codes of the D/A converter circuits 312a and 312b set to fixed values to set a state in which D.C. signals of predetermined levels are supplied from the D/A converter circuits 312a and 312b. Also, by sending control signals from the system control circuit 370 in the baseband LSI 300 to the control circuit 252 in the high frequency IC 200, the selectors 272a and 272b at the prior stage to the high gain amplifying sections 240a and 240b are controlled to cause either of the I signals and the Q signals on the transmitting side having passed the low-pass filters 261a and 261b to be supplied to the high gain amplifying sections 240a and 240b. Then, the signal level measuring circuit 360 measures the level difference between signals on the I side and signals on the Q side, and such correction values as will reduce the level difference to "0" are provided to the correcting circuits 341 and 342 to eliminate gain inconsistency between the I signal side and the Q signal side in the reception circuitry.

In the D.C. offset correction and gain correction in the measuring circuitry of □, by sending control signals from the system control circuit 370 in the baseband LSI 300 to the control circuit 252 in the high frequency IC 200, the selectors 271a and 271b at the prior stage to the signal level measuring circuit 280 are controlled to set a state in which either of the I signals and the Q signals on the transmitting side having passed the low-pass filters 261a and 261b are supplied to the signal level measuring circuit 280. Also, by sending control signals from the system control circuit 370 to the modulating circuit 330, A.C. signals of predetermined levels are caused to be supplied from the D/A converter circuits 312a and 312b to the signal level measuring circuit 280 via the selectors 271a and 271b.

Then, the signal level measuring circuit 280 detects the level difference between them. The resultant detection output is subjected to A/D conversion by the A/D converter circuit 311c, data averaged in respect of time by the averaging low-pass filter 350 is sent to the system control circuit 370 to detect any deviation in characteristics in the measuring circuitry, and any such deviation in characteristics in the measuring circuitry is corrected by providing values for correcting it to the correcting circuit 345. As A.C. signals to be supplied from the D/A converter circuits 312a and 312b then, the same A.C. signals as what is called the preamble pattern to be inserted at the beginning of the transmission packet prescribed by the IEEE802.11a Protocol regarding wireless LANs, for instance, can be used.

Further, after the completion of correction, control signals are sent from the system control circuit 370 to the modulating circuit 330 to cause the D/A converter circuits 312a and 312b to supply a plurality of A.C. signals differing in level to the signal level measuring circuit 280. The output of the measuring circuitry then is taken into the system control circuit 370 in a time series, and table data indicating the matching between the level of the A.C. signals supplied and the output voltage of the measuring circuitry are prepared and stored into a data memory (see FIG. 9) within the system control circuit 370. The table data is used for estimating the actual level of reception signals from the output voltage of the measuring circuitry in a receiving operation. Incidentally, regarding the second signal level measuring circuit 360, too, table data indicating the matching between the level of the A.C. signals supplied in advance and the output voltage of the measuring circuitry may be prepared and stored into a data memory within the system control circuit 370.

As described so far, in this embodiment of the invention, in gain balance correction between the I side and the Q side of the transmission circuitry of (3), it is so set that D.C. signals be supplied from the D/A converter circuits 312a and 312b, the I signals and the Q signals having passed the low-pass filters 261a and 261b are alternately supplied to either one of the high gain amplifying sections 240a and 240b on the transmitting side, the level difference between signals on the I side and signals on the Q side is measured by the signal level measuring circuit 360, and gain correction is carried out on that basis. Therefore, gain inconsistency between the I signal side and the Q signal side of the transmission circuitry can be accurately eliminated.

Also, in gain balance correction between the I side and the Q side of the reception circuitry of (4), it is so set that D.C. signals be supplied from the D/A converter circuits 312a and 312b, either the I signals or the Q signals on the transmitting side having passed the low-pass filters 261a and 261b are supplied to the high gain amplifying sections 240a and 240b, the level difference between signals on the I side and signals on the Q side is measured by the signal level measuring circuit 360, and gain correction is carried out on that basis. Therefore, gain inconsistency between the I signal side and the Q signal side of the reception circuitry can be accurately eliminated.

Further in this embodiment of the invention, as the outputs of the low-pass filters 261a and 261b are similarly supplied to the measuring circuit 280 and the high gain amplifying sections 240a and 240b via the selectors 271a, 271b, 272a and 272b, there are additional advantages that the I signal side and the Q signal side of the transmission circuitry become symmetric circuit-wise, and that the addition of the measuring circuitry does not invite gain inconsistency between the I signal side and the Q signal side.

Moreover in this embodiment of the invention, since the I signals and the Q signals on the transmitting side having passed the low-pass filters 261a and 261b are supplied to the high gain amplifying section 240a or 240b, it is possible to have signal components of and above the Nyquist rate cut by the low-pass filters 261a and 261b and supply the signals cleared of these components to the high gain amplifying section 240a or 240b. This makes it unnecessary to provide an antialiasing filter between the baseband LSI 300 and the high frequency IC 200, and enables architecture of a compact radio communication system involving a reduced number of constituent parts. Furthermore, since gain correction is possible during actual use after the system has been architected, any inconsistency between the I signal side and the Q signal side due to aging or a change in ambient conditions including the temperature can be corrected.

Next will be described a specific example of configuration of the signal level measuring circuitry (including 280, 360 and so forth). In this embodiment of the invention, the measuring circuit 280 for rough detection of signal levels and the second measuring circuit 360 for more exact detection are provided as components of the measuring circuitry for the following reason. Thus, in a wireless LAN system for instance, signals with a level difference of −82 dB to −30 dB, almost 400 times at the maximum, are allowed as reception signals to be entered into the high gain amplifying sections 240a and 240b. Therefore, even if these signals are directly subjected to A/D conversion using a 10 bit AND converter circuit, their accuracy cannot be substantially improved. For this reason in this embodiment, after first roughly detecting the levels of the I and Q signals with the measuring circuit 280 and narrowing down the range of signal levels by roughly controlling the gains of the high gain amplifying sections 240a and 240b on the basis of those detected levels, the gains of the high gain amplifying sections 240a and 240b are set more accurately by measuring signal levels exactly using the second measuring circuit 360.

Figure 2A:
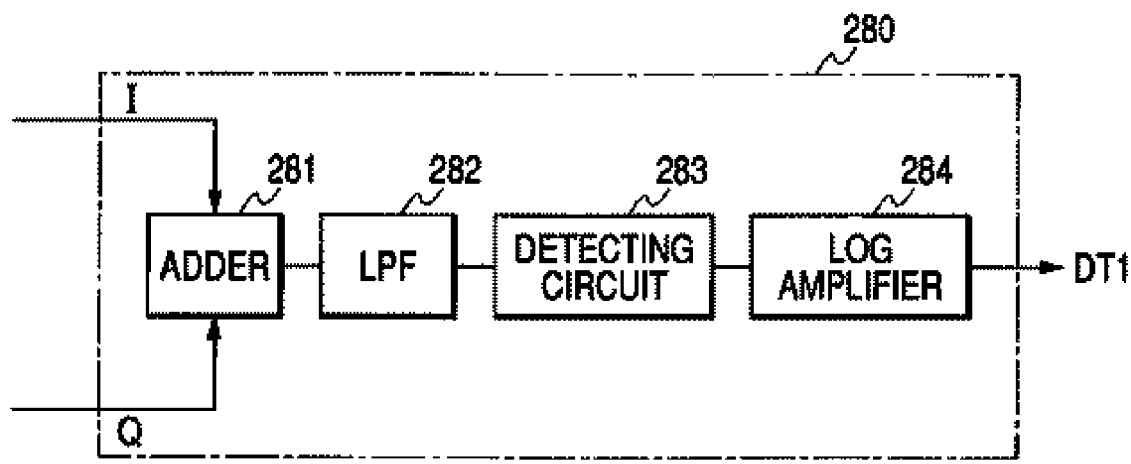
FIG. 2(A) is a block diagram showing an example of configuration of first signal level measuring circuit 280 and FIG. 2(B) is a block diagram showing an example of configuration of second signal level measuring circuit 360.

FIG. 2(A) shows an example of first signal level measuring circuit 280 provided in the high frequency IC 200. The signal level measuring circuit 280 in this embodiment of the invention comprises an adder for adding the I signals and the Q signals, a low-pass filter 282 for removing unnecessary waves from the signals after the addition, a detecting circuit 283 for rectifying signals (A.C.) having passed the low-pass filter 282 into D.C. signals, and a Log amplifier 284 for supplying a detected value DT1 resulting from the logarithmic compression of the converted signals. The logarithmically compressed detected value DT1 is converted by the A/D converter circuit 311c into a digital signal, which is supplied to the system control circuit 370. Instead of separately providing the output detecting circuit 283 and the Log amplifier 284 separately, a circuit capable of detection and logarithmic compression at the same time can be used as well.

The reason for the presence of the Log amplifier 284 for logarithmic compression is the vast legal differences among the reception signals entered into the high gain amplifying sections 240a and 240b ranging from −82 dB to −30 dB, almost 400 times at the maximum, as stated above. The logarithmic compression makes possible, when the output voltage is limited to a narrow range, such as from 0.5 to 1.5 V, to make variations in output voltage greater where the signal level is lower than where it is higher, i.e. to increase sensitivity to low level signals.

Figure 3:
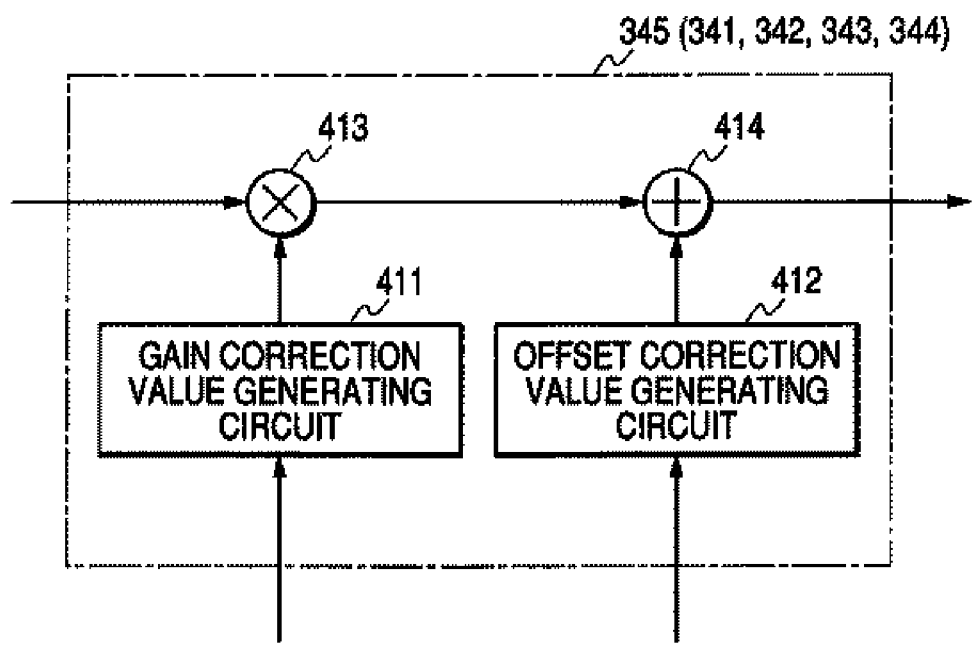
FIG. 3 is a circuit diagram showing a specific example of D.C. offset and gain correcting circuits built into a baseband LSI of an embodiment of the invention.

FIG. 3 shows an example of configuration of the correcting circuit 345 arranged at a stage subsequent to the signal level measuring circuit 280. Though not shown, the other correcting circuits 341 through 344 are similarly configured. The correcting circuit 345 in this embodiment of the invention comprises a gain correction value generating circuit 411 for generating gain correction values on the basis of control data supplied from the system control circuit 370, an offset correction value generating circuit 412 for generating offset correction values, a multiplier circuit 413 for multiplying correction values generated by the gain correction value generating circuit 411 by measurements from the A/D converter circuit 311c, and an adder circuit 414 for adding the output values of the multiplier circuit 413 and correction values generated by the offset correction value generating circuit 412.

Figure 4:
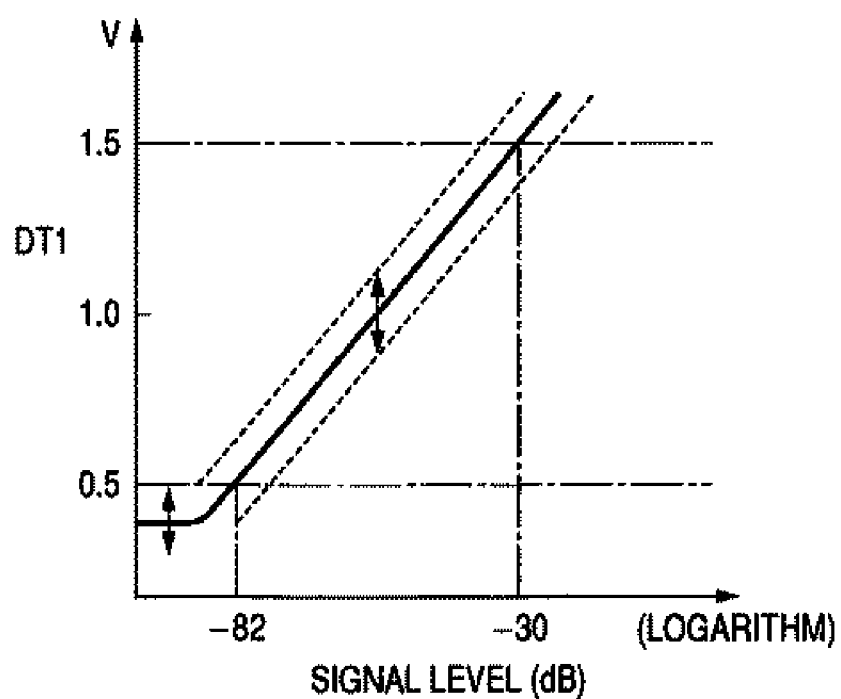
FIG. 4 is a characteristic diagram showing the relationship between the input signal level and the output voltage of the first signal level measuring circuit in the embodiment of the invention.

The signal level measuring circuit 280 shown in FIG. 2(A) is so designed that its output DT1 be in a substantially linear relation ship to the input signal level as indicated by a solid line in FIG. 4. In fact, however, the gain of the signal path from the input end of the signal level measuring circuit 280 to the output end of the averaging filter 350 (see FIG. 1) may be varied or distorted by fluctuations in element manufacturing as indicated by broken lines in FIG. 4. In view of this possibility, gains are corrected by the correcting circuit 345 in this embodiment so that the output DT1 of the measuring circuit 280 be have a predetermined relationship to signals in a range of −82 dB to −30 dB.

Further, the output DT1 of the measuring circuit 280, as shown in FIG. 4, becomes saturated in the vicinity of −82 dB and no longer varies linearly to signals of or below a certain level. Moreover, that saturation point is moved up and down by fluctuations in element manufacturing. In view of this problem, this embodiment is so configured that offsets be corrected by the correcting circuit 345 to ensure linear variations of the output DT1 of the measuring circuit 280 relative to signals in the range of −82 dB to −30 dB. Incidentally in the graph of FIG. 4, the signal level on the horizontal axis is graduated on a logarithmic scale.

Figure 2B:
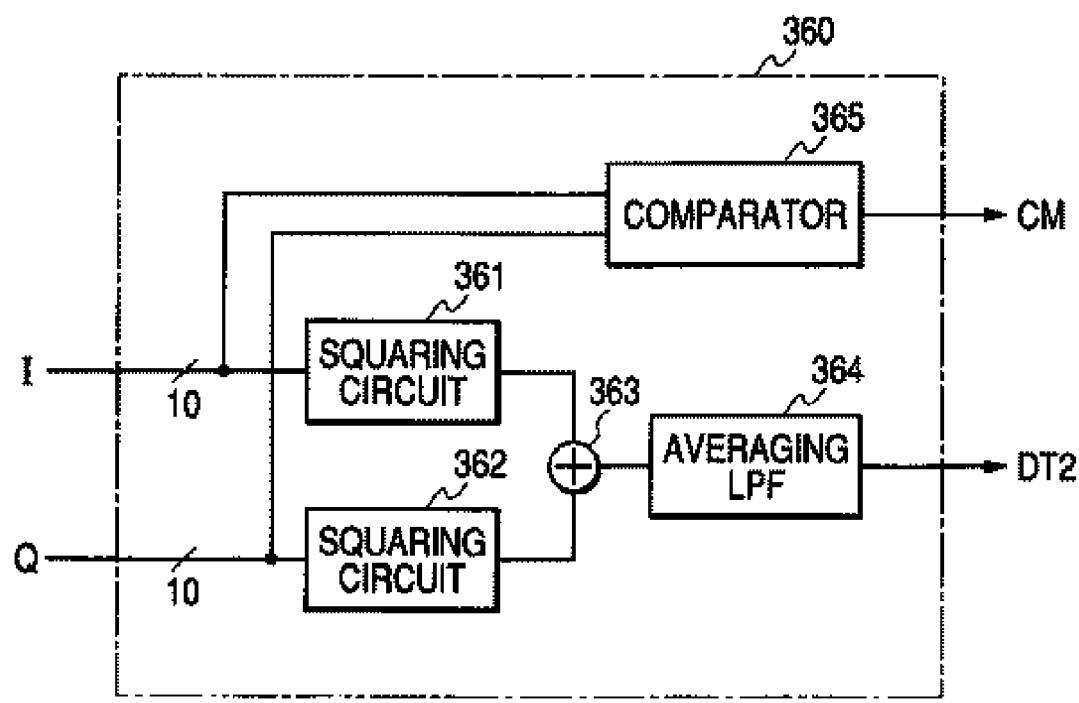

FIG. 2(B) shows an example of second signal level measuring circuit 360 provided in the baseband LSI 300. The second signal level measuring circuit 360 in this embodiment is provided with squaring circuits 361 and 362 for squaring the I signals and the Q signals, an adder 363 for adding the squared values, an averaging filter 364 for taking the time average of the added value, and a comparator circuit 365 for comparing the entered I signals and Q signals. It supplies from the averaging filter 364 a detected value DT2 according to the total signal level of the I signals and the Q signals within a predetermined length of time. The comparator circuit 365 determines which of the I signals and the Q signals are higher in level, and supplies a signal CM representing the result of determination.

The detected value DT2 and the signal CM indicating the result of determination of the relative level from the second signal level measuring circuit 360 is supplied to the system control circuit 370. To add, the second signal level measuring circuit 360 of this embodiment is a digital circuit, unlike the signal level measuring circuit 280 shown in FIG. 3, and the inputs I and Q are also digital values. The signal CM indicating the result of determination of the relative level is used in gain balance correction between the I side and the Q side of the transmission circuitry and gain balance correction between the I side and the Q side of the reception circuitry, both described above, and facilitates finding of the result of determination of the relative gain levels.

Figure 5:
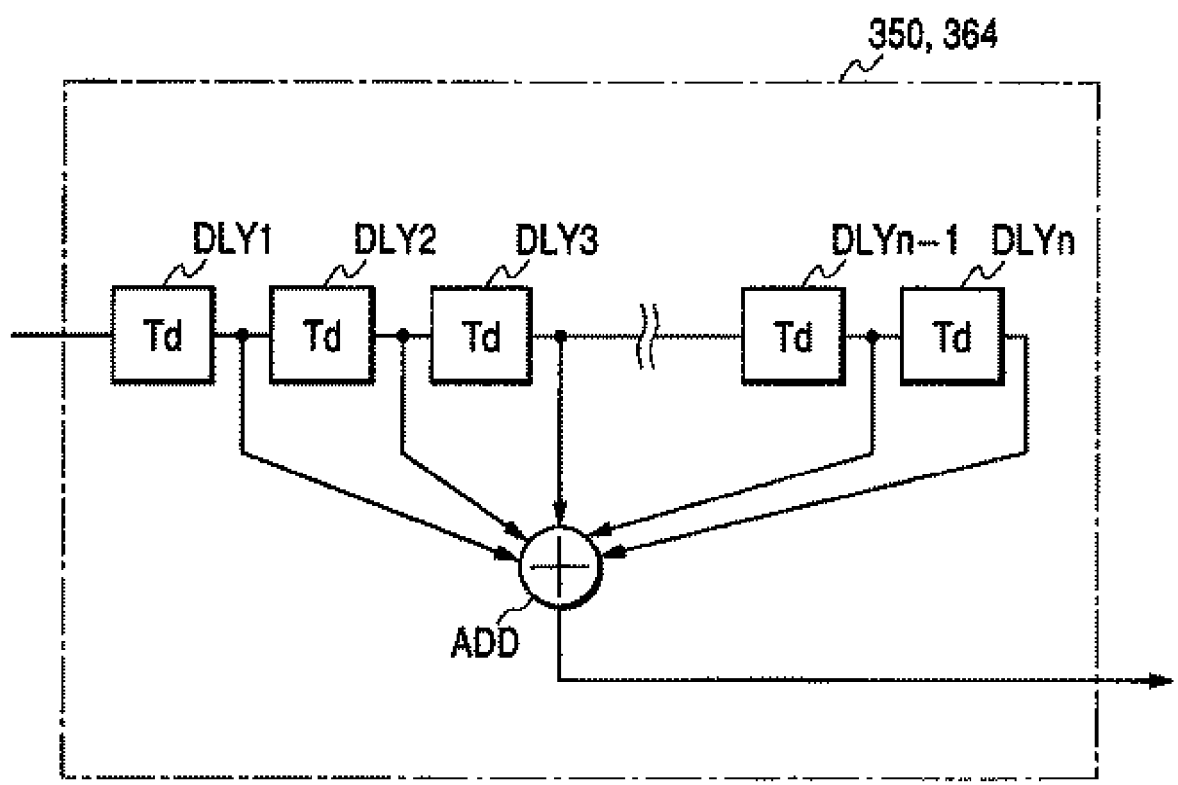
FIG. 5 is a block diagram showing an example of configuration of an averaging filter.

The averaging filter 364 has a similar configuration to the aforementioned averaging filter 350 at a state subsequent to the correcting circuit 345 and, as shown in FIG. 5, can be composed of a plurality of delay circuits DLY1, DLY2, . . . DLYn connected in multiple stages, and an adder ADD for adding signals delayed by the delay circuits. Each of the delay circuits DLY1, DLY2, . . . DLYn may, though is not required to, have a delay time Td equal to the period of the sampling clocks φs of the A/D converter circuits 311a through 311c.

Such delay circuits may be configured of, for instance latch circuits, which take in input data in synchronism with clocks, or flip-flops. Therefore, the delay circuits DLY1, DLY2, . . . DLYn can be regarded as shift registers. In the averaging filter of FIG. 5, if the level of the reception signals is constant, the filter output which is the total of the outputs of these delay circuits gradually rises from the time the first input signal enters the delay circuit DLY1 until it reaches the delay circuit DLYn, but becomes substantially constant after that.

The number of stages "n" in the averaging filter 350 is so set that a signal entered into the delay circuit DLY1 be outputted from the delay circuit DLYn at the final stage in 0.8 μs (microsecond). The 0.8 μs here corresponds to the period of a preamble pattern at the beginning of the packet prescribed by the wireless LAN Protocol. In this embodiment, the signal transmission time from the input end to the output time in the averaging filter 364 within the second signal level measuring circuit 360 is set to 1 μs, though not necessarily required to be 1 μs. Incidentally, inputs to the averaging filters 350 and 364 are supposed to have numbers of bits matching the respective resolutions of the matching A/D converter circuits 311*a*, 311*b* and 311*c*. More specifically in this embodiment, the input to the averaging filter 350 is supposed to have four bits, and that to the averaging filter 364, 10 bits.

Figure 7:
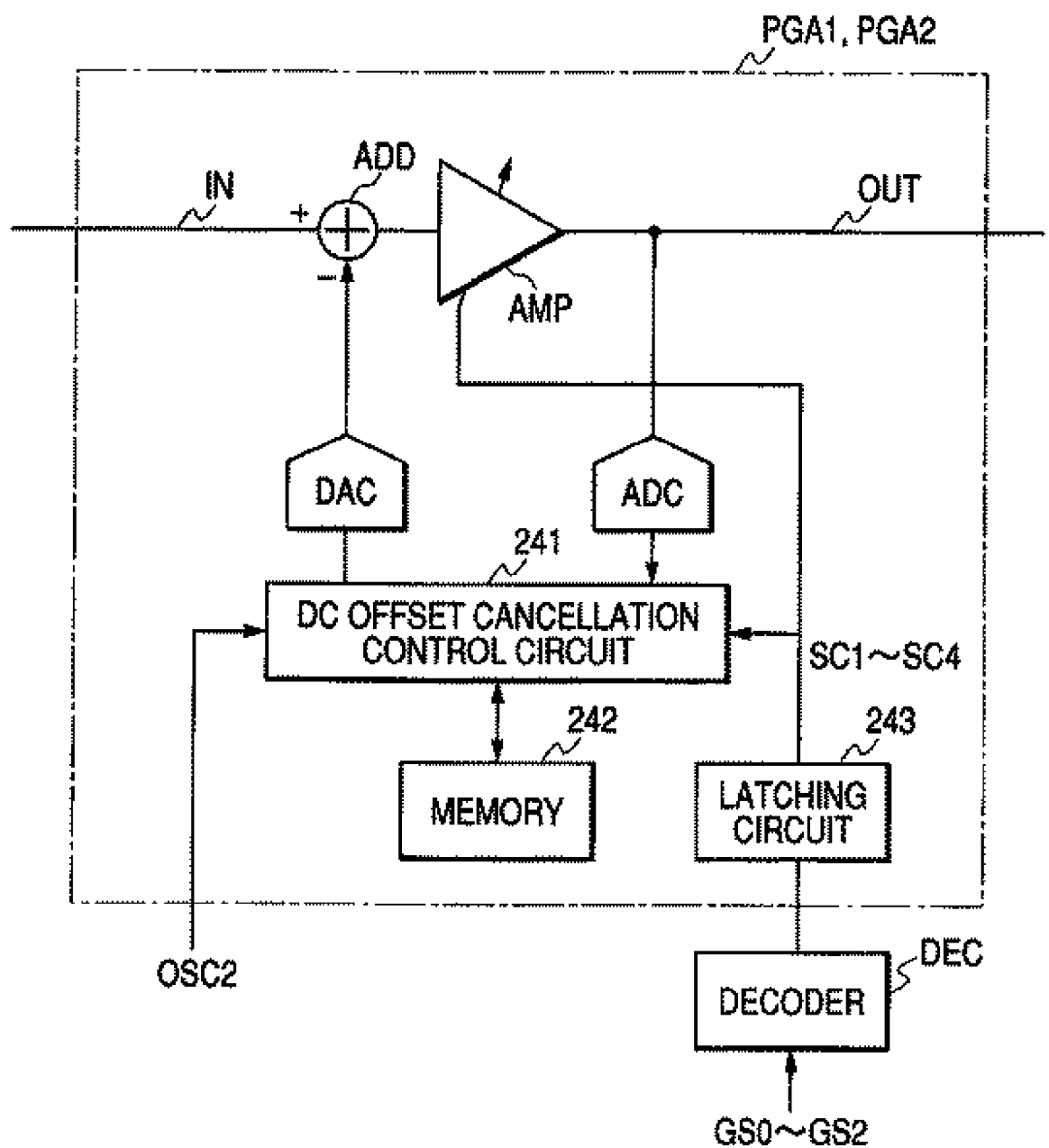
FIG. 7 is a block diagram showing an example of configuration of a variable gain amplifier circuit constituting the high gain amplifying section in the embodiment of the invention.

FIGS. 6(A), 6(B) and FIG. 7 show specific examples of configuration of the high gain amplifying sections 240*a* and 240*b*.

As shown in FIG. 6(A), each of the high gain amplifying sections 240*a* and 240*b* has a configuration in which low-pass filters LPF1, LPF2 and LPF3 and gain-controllable amplifier circuits PGA1, PGA2 and PGA3 are alternately connected in series. The gains of the gain-controllable amplifier circuits PGA1, PGA2 and PGA3 are controlled with gain signals GCS1, GCS2 and GCS3, respectively.

The low-pass filters LPF1, LPF2 and LPF3 and the gain-controllable amplifier circuits PGA1, PGA2 and PGA3 are alternately connected as shown in FIG. 6(B) for the following reason. Thus, as is seen from FIG. 6(B)(a) showing the frequency components of the input to the low-pass filter LPF1, where the level of the target reception signal TS is surpassed by an interfering wave DWV1 on an adjoining channel and/or an interfering wave DWV2 on an non-adjoining channel, if the target reception signal TS is amplified to the desired level at once, the interfering waves will be amplified at the same rate. However, only the target reception signal can be amplified to the desired level as shown in (h) by amplifying the target reception signal TS while suppressing the interfering waves of higher frequencies step by step as shown in (c) through (g) with a low-pass filter characteristic shown in (b).

Each of the gain-controllable amplifier circuits PGA1 and PGA2 at the first and second stages, as shown in FIG. 7, comprises a variable gain amplifier AMP, an adder ADD provided at a state prior thereto, an A/D converter ADC for converting the output of the variable gain amplifier AMP into digital signals, an offset cancellation control circuit 241, a memory circuit 242 consisting of a RAM or a register for storing offset cancellation values detected by the offset cancellation control circuit 241, a D/A converter DAC for converting into analog signals the offset cancellation values stored in the memory circuit 242, and a latch circuit 243 for latching gain switching signals SC1 through SC4. The gain-controllable amplifier circuit PGA3 at the third stage is something like the circuit of FIG. 7 with the memory circuit 242 being omitted.

In the gain-controllable amplifier circuits PGA1 and PGA2 at the first and second stages, when the offset cancellation control circuit 241 receives from the control circuit 252 a start instruction signal OCS2 for offset cancellation, the offset of the variable gain amplifier AMP is detected from the output of the A/D converter ADC, and a value to reduce that offset to "0" (offset cancellation value) is generated, and stored into the memory circuit 242. Such an offset detection formula is disclosed in the Japanese Unexamined Patent Publication No. 2002-217762 and elsewhere. Since the offset cancellation value can be determined by consecutive comparing actions by the A/D converter ADC, the A/D converter ADC can be configured of a simple circuit, such as one consisting of a comparator and a resistor voltage divider circuit to give voltages to be compared by the comparator.

In the radio communication system of this embodiment, the generation and storing of the offset cancellation values are accomplished by sending a predetermined command from the system control circuit 370 of the baseband LSI 300 to the control circuit 252 at the time of turning on power supply, when switching from transmission to reception, or during an otherwise idle period such as a period of standby. When gain control data WD1 is sent to the gain control circuit 251 at the time of starting reception, the adder ADD cancels offsets by reading in response offset cancellation values stored in the memory circuit 242 and supplying them to the D/A converter DAC.

On the other hand, the gain-controllable amplifier circuit PGA3 at the third stage is so configured that, when the offset cancellation control circuit 241 receives from the gain control circuit 251*a* start instruction signal OCS2 for offset cancellation, offset detection and cancellation are carried out on a real time basis.

Regarding offset cancellation in the reception circuitry, a formula by which offset detection and cancellation are carried out by all the amplifiers from the first through third stages substantially at the same time when reception is started, the formula of this embodiment by which offsets are detected and offset cancellation values are stored in advance has an advantage that offset cancellation can be completed in a short period of time to start reception.

Figure 8:
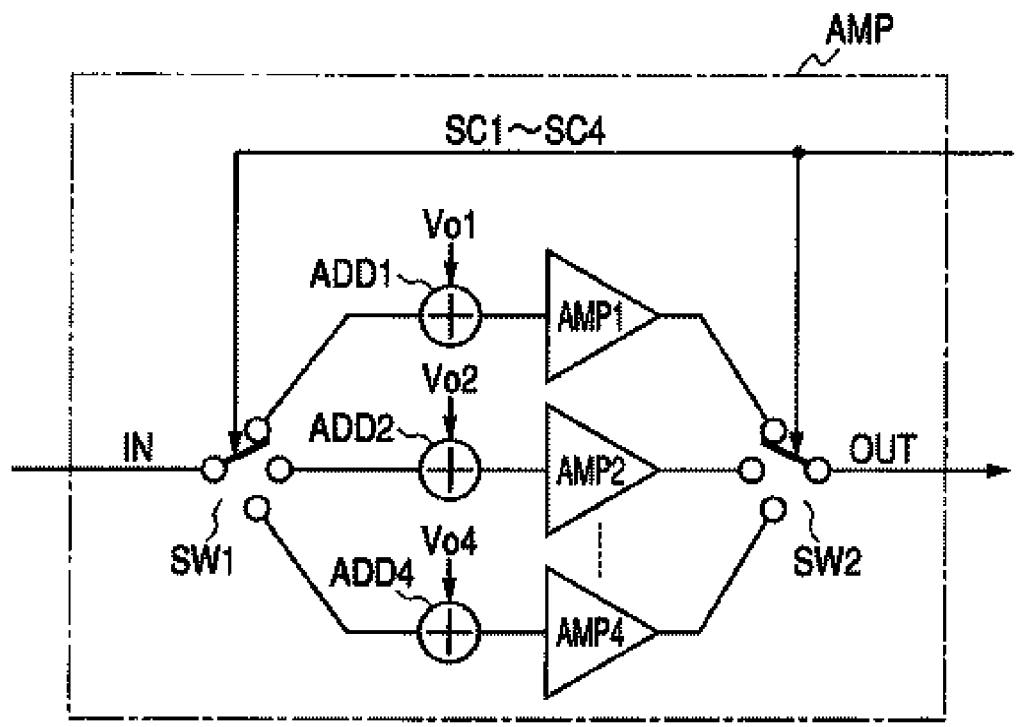
FIG. 8 is a circuit configuration diagram showing an example of configuration of the variable gain amplifier circuit.

Each of the gain-controllable amplifier circuits PGA1 and PGA2 at the first and second stages of this embodiment uses, as the variable gain amplifier AMP, a circuit consisting of four fixed gain amplifiers AMP1 through AMP4, adders ADD 1 through ADD4 respectively matching those amplifiers, an input change-over switch SW1 and an output change-over switch SW2 as shown in FIG. 8. The offset cancellation control circuit 241 is so configured as to detect in advance any offset in each of the fixed gain amplifiers AMP1 through AMP4, generate an offset cancellation value to reduce that offset to "0", and store it into the memory circuit 242.

In this embodiment of the invention, the gain of the amplifier AMP1 is supposed to be 0 dB, that of the amplifier AMP2, +6 dB, that of the amplifier AMP3, +12, and that of the amplifier AMP4, +18 dB, though their gains are not limited to these values. In the gain-controllable amplifier circuit PGA1, offset cancellation values are detected according to the gains of the amplifiers AMP1 through AMP4, and stored into the memory circuit 242. On the other hand, in the gain-controllable amplifier circuit PGA2, according to the combinations of the gains of its own amplifiers AMP1 through AMP4 and the gains of the amplifiers AMP1 through AMP4 of the gain-controllable amplifier circuit PGA1 at the prior stage, offset cancellation values are detected and stored into the memory circuit 242. However, the number of combinations of gains for which offset cancellation values can be detected and stored into the memory circuit 242 in the gain-controllable amplifier circuit PGA2 is not all of the theoretically possible combinations (16) but limited to the combinations of settable gains (see FIG. 14) (eight).

The configuration is such that, at the time of starting reception, when gain setting codes GS0 through GS2 designating the gains of the variable gain amplifiers AMP of the gain-controllable amplifier circuits PGA1 and PGA2 are supplied from the control circuit 251, the input change-over switch SW1 and the output change-over switch SW2 are switched in response to those codes. At the same time, the offset cancellation control circuit 241 reads out of the memory circuit 242 offset cancellation values respectively matching the gain setting codes GS0 through GS2, supplies them to the D/A converter DAC, causes the adder ADD to add the offset cancellation values to the input, and thereby causes the D.C. offsets of the amplifiers to be cancelled.

To add, although it is also possible to provide, in the vicinity of the gain-controllable amplifier circuits PGA1 and PGA2, the decoder DEC for generating switching control signals SC1 through SC4 for the switches SW1 and SW2 by decoding the gain setting codes GS0 through GS2 as shown in FIG. 7, in this embodiment the decoder DEC for decoding the gain setting codes GS0 through GS2 is arranged on the side of the gain control circuit 251 of FIG. 1.

On the other hand, the gain-controllable amplifier circuit PGA3 at the third stage is configured of a plurality of, for instance 13, fixed gain amplifiers differing in gain from one another, an input change-over switch and an output change-over switch, the switches are changed over from one to the other with gain setting signals GS10 through GS13 and, after the switch change-over, offset detection and offset cancellation are carried out on a real time basis. In this embodiment, the gain-controllable amplifier circuit PGA3 is configured to be able to select any gain out of −6 dB, −4 dB, +2 dB, 0 dB, +2 dB, +4 dB, +6 dB, +8 dB, +10 dB, +12 dB, +14 dB, +16 dB and +18 dB, though the range of selection is not necessarily limited to this.

Some variable gain amplifiers have a circuit type which allows them to vary their gains continuously, but such amplifiers consume considerably more power than fixed gain amplifiers. To avoid this, by providing a plurality of fixed gain amplifiers as in this embodiment and selecting and operating one out of them, the overall power consumption of the chip can be reduced. Incidentally, while the adders ADD1 through ADD4 are provided between the input change-over switch SW1 and the amplifiers AMP1 through AMP4, respectively, in the embodiment shown in FIG. 8, it is also possible to reduce the number of adders by providing one at the stage before the input change-over switch SW1.

Next will be described the method to control gains in the reception circuitry including the high gain amplifying sections 240a and 240b in this embodiment of the invention.

Gain control in the reception circuitry is performed by the system control circuit 370 in the baseband LSI 300. The system control circuit 370 has a similar configuration to a general purpose microcomputer operating in accordance with programs. As shown in FIG. 9, it comprises a central processing unit (CPU) 371 for processing various computations and generating control signals at the instructions of the programs; a program memory 372 consisting of a read only memory (ROM) for storing programs to be executed by the CPU and fixed data necessary for the execution of the programs; a data memory 373 consisting of a random access memory (RAM) for providing a work area for the CPU and storing transient data, such as the results of computations; an input port 374 into which signals from the averaging filter 350 and the second signal level measuring circuit 360 in FIG. 1 are entered; an output port 375 for supplying control signals to circuits within the chip, such as the correcting circuits 341 through 345 and control signals and control data to the gain control circuit 251 and the control circuit 252 in the high frequency IC 200; and a bus 376 for connecting these circuit blocks.

Figure 10:
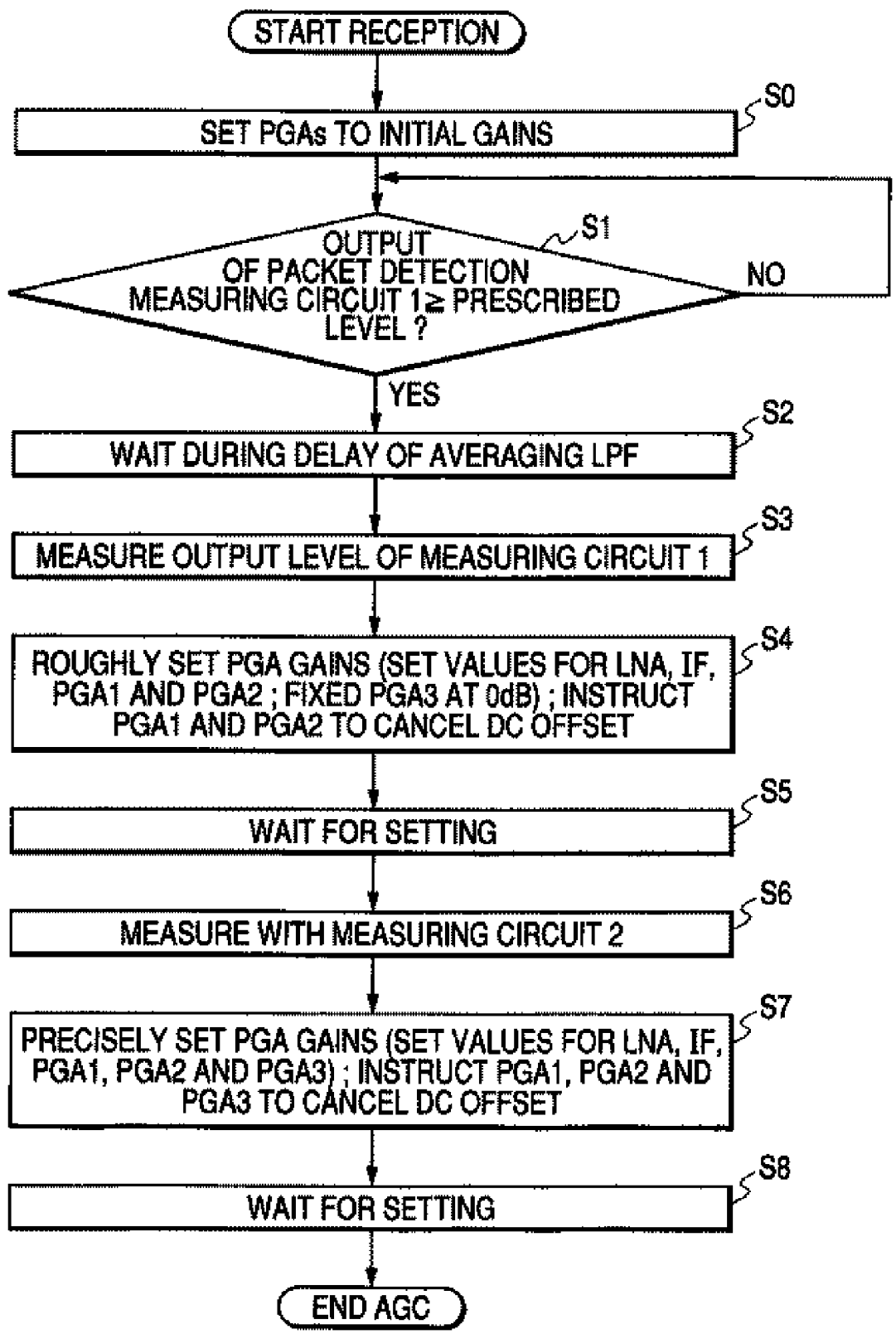
FIG. 10 is a flow chart showing an example of sequence of reception processing by the control circuit built into the baseband LSI.

Upon determining that the operating mode for reception is on, the system control circuit 370 starts control in accordance with the flow chart of FIG. 10.

In reception control, the system control circuit 370 first sends to the high frequency IC 200 a D.C. offset cancellation control signal OCS1 (step S0). Then in the high frequency IC 200, the low noise amplifier 221, the IF amplifier 222, and the variable gain amplifiers PGA1 through PGA3 in the high gain amplifying sections 240a and 240b are set to any desired initial gains. The system control circuit 370, by sending a command to the control circuit 252 of the high frequency IC 200, performs control to cause the selectors 271a and 271b to supply the outputs of the mixers 232a and 232b to the signal level measuring circuit 280.

After that, the system control circuit 370 references the detected value DT1 from the averaging filter 350, determines whether or not the output of the signal level measuring circuit 280 has reached or surpassed a preset predetermined value, and thereby detects the presence or absence of a reception packet (step S1). If any reception packet is detected, the system control circuit 370, after waiting for stabilization of the output of the averaging filter 350 (which takes 0.8 µs), takes in the output from the averaging filter 350 as the detected value DT1 of the signal level measuring circuit 280 (steps S2 and S3).

Next, the system control circuit 370 references a data table in the data memory 373, determines the approximate gains of the low noise amplifier 221, the IF amplifier 222, and the gain-controllable amplifier circuits PGA1 and PGA in the high gain amplifying sections 240a and 240b such that the levels of the I and Q reception signals entered into the baseband LSI 300 in response to the detected value DT1 of the signal level measuring circuit 280 be contained within a predetermined range, and supplies gain control data GS0 through GS2 and GS10 through GS13 and the offset cancellation control signal OCS1 to the gain control circuit 251 of the high frequency IC 200 (step S4).

In the high frequency IC 200, this results in switching of the amplifier to be used (rough gain setting) in the gain-controllable amplifier circuits PGA1 and PGA2 at the first and second stages, and reading of an offset cancellation value according to the amplifier to be used out of the memory circuit 242 (see FIG. 7) to cancel D.C. offsets. Incidentally at this stage, the gain of the gain-controllable amplifier circuit PGA3 at the third stage in the high gain amplifying sections 240a and 240b is set according to the gain control data GS10 through GS13 to, for instance "0 dB". The reason will be explained in detail afterwards.

Upon completion of the rough gain setting, the system control circuit 370 waits until the I and Q signals supplied from the high gain amplifying sections 240a and 240b settle down (step S5). Then, the system control circuit 370 takes in the output value DT2 of the second signal level measuring circuit 360 (step S6).

Next, the system control circuit 370 references the data table in the data memory 373, determines the gains of the low noise amplifier 221, the IF amplifier 222, and the gain-controllable amplifier circuits PGA1, PGA2 and PGA3 in the high gain amplifying sections 240a and 240b such that the levels of the I and Q reception signals entered into the baseband LSI 300 in response to the detected value DT1 of the signal level measuring circuit 360 be at a predetermined level, and supplies the gain control data GS0 through GS2 and GS10 through GS13 and the offset cancellation control signal OCS1 to the gain control circuit 251 of the high frequency IC 200 (step S7).

In the high frequency IC 200, this results in switching of the amplifier to be used (precise gain setting) in the gain-controllable amplifier circuits PGA1, PGA2 and PGA3, and reading of a set gain, i.e. an offset cancellation value according to the amplifier to be used, out of the memory circuit 242 to cancel D.C. offsets. In the gain-controllable amplifier circuit PGA3 at the third stage, detection of D.C. offsets and cancellation of the offsets are executed on a real time basis. Upon completion of precise gain setting, the system control circuit 370 waits until the I and Q signals supplied from the high gain amplifying sections 240a and 240b settle down, and then shifts to reception processing (step S8).

FIG. 11 show the timings of various signals in the execution of control by the system control circuit 370 in accordance with the flow chart of FIG. 10, and FIG. 12 illustrates an example of pattern structure of the leading part of a packet transmitted and received in a wireless LAN system conforming to the IEEE802.11a Protocol.

As shown in FIG. 11, at a timing TM1 at which the mode signal is switched to a reception state, the system control circuit 370 sends to the high frequency IC 200 a D.C. offset cancellation control signal OCS1. After the lapse of any desired length of time Td1, reception signals begin to enter from the antenna terminal into the high frequency IC 200 (timing TM2). Then at a timing TM3 after a length of time Td2, I and Q signals begin to be supplied from the high frequency IC 200.

As shown in FIG. 12, the wireless LAN Protocol prescribes that the leading part of a transmission/reception packet shall have a short symbol period Tf1 (8 μs) in which a pattern having a 0.8 μs period (preamble pattern) appears 10 times, that during the period Tf11 of the first seven appearances of the pattern (t1 through t7) packet detection and gain control shall be performed, and that during the period Tf12 of the remaining three appearances of the pattern (t8 through t10) frequency tuning in the PLL circuit 211 of FIG. 1, the D.C. offset adjustment of the amplifiers and timing synchronization shall be accomplished. It is further prescribed that the short symbol period Tf1 shall be followed by a long symbol period Tf2 (8 μs) consisting of a 1.6 μs card interval G12 and two patterns T1 and T2 having the same 3.2 μs period as the data area, and that fine adjustment of frequency and D.C. offsets shall be during this long symbol period Tf2.

In the baseband LSI 300 of this embodiment, from a timing TM4 when a time length of Td3 has passed since the timing TM3 of FIG. 11 when the preamble pattern at the leading part of the packet begins to be amplified, the measuring circuit 280 detects the outputs of the mixers 232a and 232b and the output of the averaging filter 350 begins to rise gradually. The output of the averaging filter 350 differs in rising rate (the inclination in the t1 period in FIG. 11) with the reception signal level. If the reception signals are at or above a predetermined level, the output of the averaging filter 350 takes on a value not lower than a certain level within the first preamble pattern period t1.

The system control circuit 370 is so configured that, when reception signals of the worst level have been entered, the presence or absence of a reception packet is determined with the level at which the output of the averaging filter 350 reaches in 0.8 μs being used as the threshold. Further the system control circuit 370, when the output of the averaging filter 350 rises to or beyond a certain level, begins measuring the level of reception signals with the measuring circuit 280 at a timing TM5, finalizes the measurement at a timing TM6, which is later by 0.8 μs, the time length of the averaging filter 350, determines the approximate gain on that basis, and sends to the high frequency IC 200 control data WD1 including the gain setting codes GS0 through GS2 and control data WD2 including the gain setting codes GS10 through GS13 together with the D.C. offset cancellation control signal OCS1.

It has to be noted that a bit CAL indicating calibration of the amplifier PGA3 at the third stage in the control data WD2 is then made "0" (=no calibration). Incidentally, FIG. 11 shows the timing at which reception signals of the worst level have been entered. When the level of reception signals is higher, the timing TM6 at which the measurement of the reception signal level is confirmed by the measuring circuit 280 is earlier than is indicated in FIG. 11.

According to the control data WD1, the gains of the low noise amplifier 221, the IF amplifier 222 and the amplifiers PGA1 and PGA2 at the first and second stages of the high gain amplifying sections 240a and 240b are set. This setting is performed while signals of the short symbol period Tf1 shown in FIG. 12 are being received. However, at this point, the gain of the amplifier PGA3 at the third stage is kept at a predetermined lower level (e.g. 0 dB).

After that, the system control circuit 370 starts measuring the level of reception signals with the measuring circuit 360, finalizes the measurement at a timing TM7, determines a precise gain on that basis, and sends to the high frequency IC 200 the control data WD1 and WD2 containing the gain setting codes GS0 through GS2 and GS10 through GS14 together with the D.C. offset cancellation control signal OCS1. This results in precise setting of the gains of the low noise amplifier 221, the IF amplifier 222, and the amplifier PGA1, PGA2 and PGA3 at the three stages of the high gain amplifying sections 240a and 240b. This takes place while signals of the long symbol period Tf2 shown in FIG. 12 are being received. Further, as the bit CAL indicating the calibration of the amplifier PGA3 at the third stage in the second control data WD2 is then made "1" (=calibration executed), offset cancellation by the amplifier PGA3 at the third stage is executed on a real time basis.

To add, referring to FIG. 12, the short symbol period Tf1 (8 μs) and the following long symbol period Tf2 (8 μs) constitute a common packet head part, and this head part and an ensuing symbol period Tf3 (4 μs) consisting of a guard interval area GI1 and a signal area SIGNAL are found in any packet with no exception. On the other hand, symbol periods (4 μs) Tf4, Tf5 . . . following the symbol period Tf3 and consisting of the guard interval area GI1 and a data area Data are data sections differing with the specification of the packet.

As the high frequency IC 200 and the baseband LSI 300 of this embodiment have to accomplish gain setting in an extremely short period at the time of starting reception, while the control data WD for gain setting from the system control circuit 370 to the gain control circuit 251 is transmitted in parallel, the control data WD to be supplied from the system control circuit 370 to the high frequency IC 200 for setting the gains of amplifiers and the like are made up of five bits with a view to reducing the number of external terminals. Therefore, it is difficult to designate the gains of all the circuits with one set of control data. For this reason, the control data is divided into two sets, WD1 and WD2, for use in gain setting.

FIG. 13 illustrates an example of configuration of the control data WD1 and WD2 in this embodiment of the invention. The control data WD1 consist of five bits including a bit GLNA designating the gain of the low noise amplifier 221, a bit GIF designating the gain of the IF amplifier 222, and bits GS0, GS1 and GS2 designating the gains of the amplifiers PGA1 and PGA2 at the first and second stages of the high gain amplifying sections 240a and 240b.

On the other hand, the control data WD2 consist of five bits including a bit CAL designating whether or not to execute D.C. offset cancellation by the amplifier PGA3 at the third stage of the high gain amplifying sections 240a and 240b, and bits GS10, GS11, GS12 and GS13 designating the gain of the amplifier PGA3 at the third stage. Since the bit GLNA designating the gain of the low noise amplifier 221 and the bit GIF designating the gain of the IF amplifier 222 consist of one bit each, the gain is switched at two steps for the low noise amplifier 221 and the IF amplifier 222.

As shown in FIGS. 11(B) and 11(C) which illustrate on an enlarged scale the parts of the rough gain setting period and the precise gain setting period of FIG. 11(A), two sets control data WD1 and WD2 are supplied in each. It has to be noted that in the control data WD2 sent during the rough gain setting period (B) the bit CAL is supposed to be "0". This causes the control circuit 252 of the high frequency IC 200 not to execute D.C. offset cancellation for the amplifier PGA3 at the third stage of the high gain amplifying sections 240a and 240b, and operates so as to provide the amplifier PGA3 at the third stage with a gain control signal to reduce the gain of the amplifier PGA3 at the third stage to 0 dB, for instance, with the bits GS10, GS11, GS12 and GS13 in the control data WD2. The control circuit 252, when the bit CAL is made "0", may as well provide the amplifier PGA3 at the third stage with a gain control signal which reduces its gain to 0 dB, for instance, irrespective of the gain setting bits GS10 through GS13.

On the other hand, in the control data WD2 sent during the precise gain setting period (C), the bit CAL is to be "1". This causes the control circuit 252 of the high frequency IC 200 to execute offset cancellation for the amplifier PGA3 at the third stage of the high gain amplifying sections 240a and 240b in synchronism with a clock CLK. As a result, while the clock CLK sent from the system control circuit 370 of the baseband LSI 300 to the control circuit 252 of the high frequency IC 200 during the rough gain setting period (B) consists of two pulses as shown in FIG. 11(B), the number of pulses of the clock CLK sent to the control circuit 252 during the precise gain setting period (C) is made greater than that of pulses during the rough gain setting period (B) as shown in FIG. 11(C).

Next will be described specific ways of rough gain setting and precise gain setting with the control data WD1 and WD2 mentioned above.

In the high frequency IC 200 of this embodiment, as stated above, the amplifiers PGA1 and PGA2 at the first and second stages of the high gain amplifying sections 240a and 240b can switch their gains at four steps, and the amplifier PGA3 at the third stage can switch its gain at 13 steps. Therefore, gains can be set in 208 (=4×4×13) ways in total. However, where certain gains are to be achieved by the high gain amplifying sections 240a and 240b as a whole, there are more than one way of distributing gains to the amplifiers at the three stages, except the maximum and minimum gains that can be set. For instance, a total of 24 dB can be obtained in any way of distribution out of 0+12+12, 6+6+12 and 6+12+6.

Therefore, if it is to be made possible to select any of all the available ways of gain distribution, the number of bits of the selection code will increase, but if the freedom of choice is reduced, the number of bits of the selection code can be reduced. In reducing the freedom of choice, where it is sufficient for the whole circuit to achieve the maximum gain that can be achieved by any single amplifier for instance, it is not very advantageous from the viewpoint of performance characteristics to assign the whole desired gain to a single amplifier. This might increase power consumption or deteriorate the quality of communication.

In a circuit wherein a plurality each of low-pass filters LPF and variable gain amplifiers PGA are alternately connected as shown in FIG. 6, generally it is preferable, if the amplification rate to be achieved is the same, to assign more gains to amplifiers at a prior stage from the noise figure (NF) viewpoint because assignment of more gains to amplifiers at a later stage would invite conspicuous reflection of noise due to NF of the amplifiers at the prior stage in the output signals. However, in some ambience of use, there may be powerful interfering waves, and in such a case assigning more gains to amplifiers at a later stage would often serve to improve the quality of communication.

Also, where the reception signal level is high and there is little need to have high gain amplifier circuits achieve very high gains, the relative level of interfering waves are often rather low, and conceivably gain distribution can be fixed to a way of giving priority to the suppression of noise due to NF. In view of this point, the system of this embodiment makes possible, with respect to the amplifiers PGA1 and PGA2 at the first and second stages and the amplifier PGA3 at the third stage, the choice of only the ways of gain distribution shown in FIG. 14 and FIG. 15 using the control codes GS0 through GS2 and GS10 through GS13 and the decoder DEC for decoding them (within the control circuit 251 of FIG. 1).

According to FIG. 14, there is only one case, where the total gain is +30 dB (column b and column c), in which there are two ways of gain distribution that make the gains of the amplifiers PGA1 and PGA2 the same, and there is only one way in all other cases. That is to say, the number of ways of gain distribution is reduced and the freedom is limited. Since there are 16 possible combinations in total of the gains of two amplifiers whose gains are variable at four steps, four control bits would be required to make available every possible way of gain distribution. By contrast in this embodiment, three is made sufficient as the number of three bits of the control code by limiting the number of ways of gain distribution that can be chosen. Correspondingly, the decoder DEC for decoding the control code GS0 can be so configured as not to have to supply unnecessary gain selection signals SC1 through SC4.

Further, in columns b, e and g among the ways of gain distribution shown in FIG. 14, as the gain is higher in PGA1 at the prior stage than in PGA2, it is seen that priority is given in gain distribution to the suppression of noise due to NF, i.e. securing a satisfactory level of NF. On the other hand in column c of FIG. 14, as the gain is higher in PGA2 at a later stage than in PGA1 at a prior stage, it is seen that priority is given in gain distribution to the suppression of interfering waves. Thus in this embodiment, the overall priority is given in gain distribution to securing a satisfactory level of NF in more cases. This is because noise due to NF always poses a problem while there is no or little interfering wave in some ambience of use.

It is further seen that in this embodiment two ways of gain distribution that make the gains of the amplifiers PGA1 and PGA2 the same are available only when it is desired to have a high total gain, such as +30 dB (where the level of reception signals is low) as shown in FIG. 14. This is because the relative level of interfering waves is often low where the level of reception signals is sufficiently high and there is little need to achieve high gains for the high gain amplifier circuits. Accordingly, by fixing the priority in gain distribution to securing a satisfactory level of NF at or below +24 dB, ways of gain distribution, which make little sense from the viewpoint of performance characteristics, can be eliminated from the range of choice, and it is thereby made possible to reduce the number of bits of control codes.

It is also acceptable to configure a control program in such a manner that, even where the combined gain of the amplifiers PGA1 and PGA2 is to be set to +30 dB according to the result of measuring the level of reception signals, at first, a way of gain distribution giving priority to securing a satisfactory level of NF (column b) is selected and, if as a result of amplifying reception signals in that way of gain distribution many data errors are estimated from the result of checking CRC codes by the system control circuit 370 of the baseband LSI, a way of giving priority in gain distribution to the suppression of interfering waves (column c) is selected.

Figure 16:
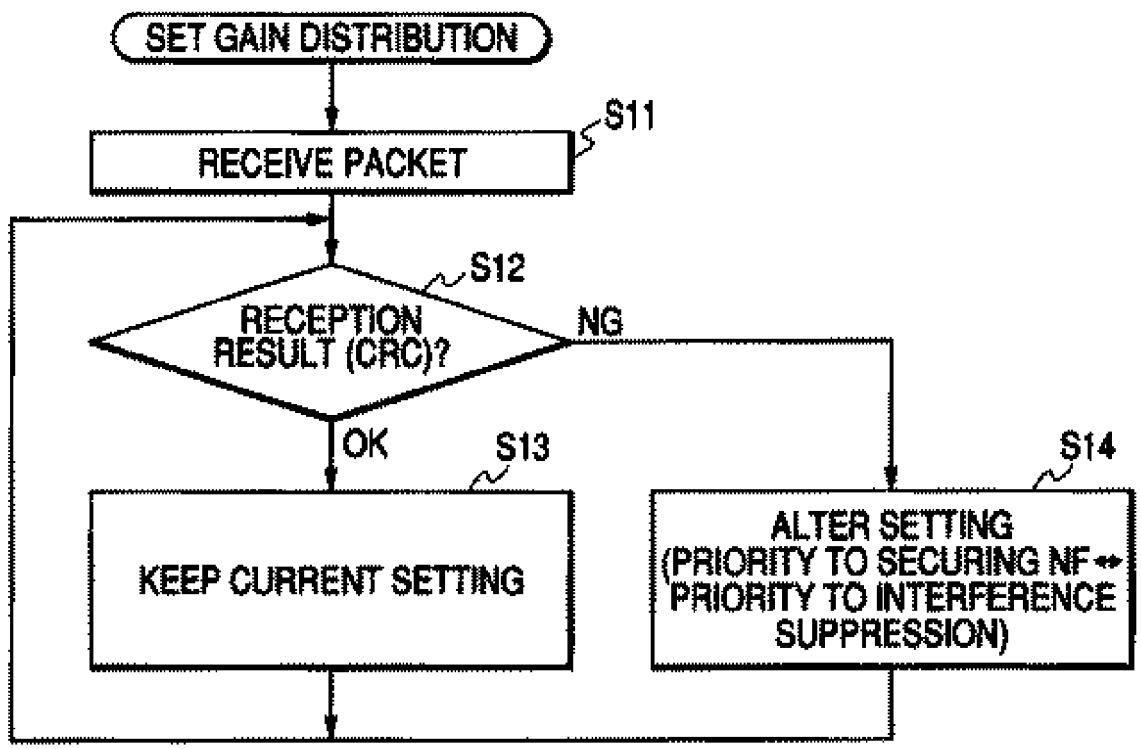
FIG. 16 is a flow chart showing an example of sequence of gain distribution setting by the control circuit built into the baseband LSI.
Figure 17:
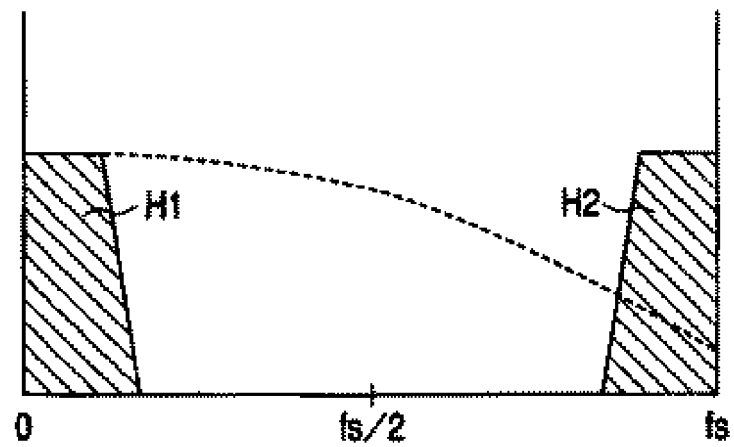
FIG. 17 is a frequency characteristic diagram of the result of DFT analysis of the output of the D/A converter circuit with the horizontal axis representing the normalized frequency.

FIG. 16 shows an example of way of gain distribution setting by the system control circuit 370. The system control circuit 370, after receiving a packet at step S11, judges whether or not there are many data errors (step S12). If it judges that there are few data errors, it goes ahead to step S13 and maintains the current way of gain distribution setting. If it judges that there are many data errors, it shifts to step S14 and, if the current way of gain distribution gives priority to securing a satisfactory level of NF, changes the setting to a way of gain distribution giving priority to the suppression of interfering waves or, if the current way of gain distribution gives priority to the suppression of interfering waves, changes the setting to a way of gain distribution giving priority to securing a satisfactory level of NF When following the control procedure shown in FIG. 16, it is not absolutely necessary to select for the first setting a way of gain distribution giving priority to securing a satisfactory level of NF because the gain distribution will be immediately switched if there are many errors. Therefore, the initial setting may give priority to a way of gain distribution giving priority to the suppression of interfering waves.

The amplifier PGA3 at the third stage of the high gain amplifying sections 240a and 240b is enabled to select any of the 13 steps of gains with the four bit control codes GS10 through GS13 as shown in FIG. 15. Since the maximum number of steps from which selection can be made with four bit codes is 16, in this embodiment extra code combinations (the bottom four) are to select −6 dB, though the choice is not necessarily confined to this. A configuration is also possible in which only one code is matched with one gain and all other codes are treated as invalid codes.

Whereas gains for the high gain amplifying sections 240a and 240b as a whole are set by combinations of the ways of gain distribution for PGA1 and PGA2 shown in FIG. 14 and the gain of PGA3 shown in FIG. 15, it is also acceptable not to make realizable all the combinations of the ways of gain distribution for PGA1 and PGA2 and the gain of PGA3, but to make some of the combinations unrealizable.

Since the correction values for use in gain correction and D.C. offset correction by the correcting circuits 341 and 342 of FIG. 1 are stored as table data in the memory 373 within the system control circuit 370, if there are many combinations of the ways of gain distribution for PGA1 and PGA2 and the gain of PGA3, the number of correction values will become correspondingly large to require many storage areas. Therefore, by making some combinations unrealizable, there is provided an advantage of making it possible to reduce the storage capacity of the memory.

FIG. 18 shows in functional blocks the high frequency IC 200 and the baseband LSI 300 constituting a wireless LAN system conforming to the IEEE802.11a Protocol.

The high frequency IC 200 comprises a demodulator & down-converter circuit 107 for orthogonally demodulating signals received from the antenna 100 and converting them into baseband signals of a lower frequency, and a modulator & up-converter circuit 233 for orthogonally modulating baseband signals for transmission supplied from the baseband LSI 300, converting them into RF signals of a higher frequency and having them transmitted from the antenna 100.

The baseband LSI 300 comprises an FEC encoder 381 for adding to transmission data a CRC code for correcting transmission errors; an interleave & mapping circuit 382 for performing interleave processing, by which adjoining data, out of the transmission data, is prevented from being arranged on adjoining subcarriers, and mapping by which the transmission data is matched with different symbols of modulating signals; an inverse fast Fourier transform (IFFT) circuit 383 for converting frequency axis information into time axis information; a guard interval inserting circuit 384 for inserting time buffer areas (guard intervals) between symbols; a D/A converter circuit 312 for converting digital signals into analog base band signals; an A/D converter circuit 311 for converting demodulated reception baseband signals (analog signals) into digital signals; a guard interval removing circuit 385 for removing guard intervals from reception signals; a fast Fourier transform (FFT) circuit 386 for converting time axis information into frequency axis information; a demapping & de-interleave circuit 387 for performing inverse processing to the interleave & mapping circuit 382; an FEC decoder circuit 388 for correcting errors in reception data by using a restored CRC code; and the system control circuit 370 for controlling the whole chip.

In OFDM modulation, the whole carrier is subject to collective demodulation processing by inverse Fourier transform by using many subcarriers, but noise waves arising in a specific frequency band on the way of transmission give rise to burst errors. Accordingly, in order to avoid burst errors due to noise waves in this specific frequency band, interleave processing is accomplished by the interleave & mapping circuit 382 to avoid arrangement of adjoining data, out of consecutive transmission data, on adjoining subcarriers.

Further in urban areas where many obstacles, such as high rise buildings, are abundant, multipaths are generated by reflections from building walls and otherwise, and a plurality of signals differing in delay time (so-called ghosts) are added to reception signals. To solve this problem, the guard interval inserting circuit 384 performs processing to add as buffer areas the tail part of one symbol signal between the valid symbols of transmission signals.

In the baseband LSI 300 of this embodiment, signals indicating the number of bits corrected by the processing by the FEC decoder circuit 388 to correct errors in reception data or the incorrectibility of data are supplied to the system control circuit 370, which judges, on the basis of the result of error correction processing by the FEC decoder circuit 388, whether or not to switch the aforementioned setting of gain distribution (step S12 in FIG. 16).

While the invention achieved by the present inventors has been hitherto described with reference to a specific embodiment thereof obviously the invention is not limited to this embodiment. In the described embodiment, for instance, the high frequency IC 200 is provided separately with the control circuit 251 for controlling gains in the reception circuitry and the control circuit 252 for controlling the whole chip, it is also possible to configure these control circuits as an integrated circuit. In that case, instead of providing control data (commands) to the control circuit 252 in serial transmission, they can be provided as parallel data of five bits, for instance, as they are provided to the control circuit 251.

Also, though the variable gain amplifiers of the gain-controllable amplifier circuits PGA1 through PGA3 in this embodiment are configured of a plurality of fixed gain amplifiers differing in gain from one another, a configuration using amplifiers whose gains are continuously variable would also be acceptable. In that case, it is advisable to use what supplies an analog voltage as the decoder for decoding the gain setting codes GS0 through GS2 and GS10 through GS13 or to provide a D/A converter circuit at a stage subsequent to the decoder.

Further, while the memory circuit 242 for storing offset cancellation values for the gain-controllable amplifier circuits PAG1 and PGA2 is provided in the high frequency IC 200 in this embodiment, the values may as well be stored in the memory 372 or 373 in the baseband LSI 300. In that case, it is possible to provide the gain-controllable amplifier circuits PAG1 and PGA2 with the D/A converter DAC, the adder ADD and a latch circuit for holding offset cancellation values, and to dispense with the A/D converter ADC for detecting the D.C. offsets of the amplifiers, the offset cancellation control circuit 241 and the memory circuit 242. Further, where offset cancellation values for the gain-controllable amplifier circuits PAG1 and PGA2 are to be provided from a device outside the chip, such as the baseband LSI 300, the D.C. offsets of the gain-controllable amplifier circuits PAG1 and PGA2 can as well be given as estimates, instead of measuring them.

Although the foregoing description mainly concerned the application of the invention by the present inventors to a wireless LAN system, which makes up the area of utilization underlying the inventive attempt, and a high frequency IC and a baseband LSI constituting it, the invention is not limited to them, but are extensively applicable to, for instance, radio communication systems, such as cellular phones of the W-CDMA formula or the like and high frequency ICs and baseband LSIs constituting them.

Advantages achieved by the present invention disclosed in this application in its typical aspects will be briefly described below.

Thus according to the invention under the present application, in a communication semiconductor integrated circuit (high frequency IC) constituting a radio communication system such as a wireless LAN, correction of the D.C. offsets of the amplifiers for amplifying reception signals can be completed in a relatively short period of time. Also, setting of the optimal gain in the high gain amplifying section for amplifying reception signals can be promptly accomplished in a predetermined sequence. There is provided a further advantage of rapid and accurate detection of reception signals and of the level of reception signals.

What is claimed is:

1. A communication semiconductor integrated circuit comprising:

a demodulating circuit for demodulating I signals which are components in phase with a fundamental wave and Q signals which are components orthogonal with the fundamental wave thereto by synthesizing two types of orthogonal signals and reception signals differing in phase by 90 degrees from each other, a first amplifier circuit for amplifying to a desired level the I signals demodulated by the demodulating circuit; and a second amplifier circuit for amplifying to a desired level the Q signals demodulated by said demodulating circuit, wherein each of said first and second amplifier circuits includes:

a plurality of low-pass filters and a plurality of variable gain amplifiers alternately connected to each other in multiple stages, wherein the variable gain amplifiers at a prior stage are enabled by the supply of offset cancellation values to execute D.C. offset correction, and the variable gain amplifiers at a later stage are enabled to detect D.C. offsets and to execute D.C. offset correction, and wherein said variable gain amplifiers include a plurality of fixed gain amplifiers which are controlled to supply I signals or Q signals to be amplified.

2. The communication semiconductor integrated circuit according to claim 1, wherein each of said variable gain amplifiers is enabled by being provided with an offset cancellation value to execute D.C. offset correction.

3. The communication semiconductor integrated circuit according to claim 1, wherein said first and second amplifier circuits include offset cancellation value generating means for detecting D.C. offsets in variable gain amplifiers at different stages and generating values necessary for canceling those D.C. offsets, and wherein said first and second amplifier circuits include memory means for storing the offset cancellation values for the variable gain amplifiers at the prior state, excluding those for the later stage generated by said offset cancellation value generating means.

4. The communication semiconductor integrated circuit according to claim 1, wherein said variable gain amplifiers include a plurality of fixed gain amplifiers differing in gain from one another and switching means for selecting one out of these fixed gain amplifiers to supply the I signals or the Q signals to be amplified.

5. The communication semiconductor integrated circuit according to claim 1, wherein each of said first and second amplifier circuits are gain controllable amplifiers.

\* \* \* \* \*